(12) United States Patent
Sair et al.

(10) Patent No.: US 9,411,583 B2
(45) Date of Patent: Aug. 9, 2016

(54) VECTOR INSTRUCTION FOR PRESENTING COMPLEX CONJUGATES OF RESPECTIVE COMPLEX NUMBERS

(75) Inventors: Suleyman Sair, Chandler, AZ (US); Elmoustapha Ould-Ahmed-Vall, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 421 days.

(21) Appl. No.: 13/977,614

(22) PCT Filed: Dec. 22, 2011

(86) PCT No.: PCT/US2011/066995
§ 371 (c)(1),
(2), (4) Date: Jun. 28, 2013

(87) PCT Pub. No.: WO2013/095552
PCT Pub. Date: Jun. 27, 2013

(65) Prior Publication Data
US 2013/0275731 A1    Oct. 17, 2013

(51) Int. Cl.
*G06F 9/00* (2006.01)
*G06F 9/30* (2006.01)
*G06F 17/50* (2006.01)

(52) U.S. Cl.
CPC .......... *G06F 9/3001* (2013.01); *G06F 9/30036* (2013.01); *G06F 17/5022* (2013.01)

(58) Field of Classification Search
CPC .......................... G06F 17/5022; G06F 9/30036
See application file for complete search history.

(56) References Cited

U.S. PATENT DOCUMENTS

| | | | |
|---|---|---|---|
| 4,760,525 | A | 7/1988 | Webb |
| 5,053,987 | A | 10/1991 | Genusov et al. |
| 7,546,329 | B2 | 6/2009 | Taunton |
| 2007/0028076 | A1 | 2/2007 | Wezelenburg |
| 2010/0106944 | A1 | 4/2010 | Symes et al. |
| 2011/0040822 | A1 | 2/2011 | Eichenberger et al. |
| 2012/0191767 | A1* | 7/2012 | Anderson ............. G06F 13/366 708/497 |

FOREIGN PATENT DOCUMENTS

| | | |
|---|---|---|
| CN | 1486001 A | 3/2004 |
| CN | 101238454 A | 8/2008 |
| CN | 101238455 A | 8/2008 |
| CN | 101953131 A | 1/2011 |
| EP | 1271338 A2 | 1/2003 |
| TW | 200707285 A | 2/2007 |
| TW | 201020805 A | 6/2010 |

OTHER PUBLICATIONS

PCT International Search Report for PCT Counterpart Application No. PCT/US2011/066995, 3 pgs., (Jun. 28, 2012).

(Continued)

*Primary Examiner* — Zachary K Huson
(74) *Attorney, Agent, or Firm* — Nicholson De Vos Webster & Elliott, LLP

(57) ABSTRACT

An apparatus is described having a semiconductor chip that has an instruction execution pipeline. The instruction execution pipeline has an execution unit with logic circuitry to perform the following for an instruction: accept input vector elements representing real and imaginary parts of a plurality of complex numbers; and, present the complex conjugates of the complex numbers.

20 Claims, 22 Drawing Sheets

(56) References Cited

OTHER PUBLICATIONS

PCT Written Opinion of the International Searching Authority for PCT Counterpart Application No. PCT/US2011/066995, 4 pgs., (Jun. 28, 2012).

PCT Notification concerning Transmittal of International Preliminary Report on Patentability (Chapter I of the Patent Cooperation Treaty) for PCT Counterpart Application No. PCT/US2011/066995, 6 pgs., (Jul. 3, 2014).

Office action and Search Report with summarized English translation from Taiwan Patent Application No. 101143233, mailed Feb. 13, 2015, 7 pages.

Notice of Allowance with English translation from Taiwan Patent Application No. 101143233, mailed Sep. 25, 2015, 3 pages.

Office action with English translation of Search Report from Chinese Patent Application No. 201180075828.8, mailed Dec. 28, 2015, 11 pages.

* cited by examiner

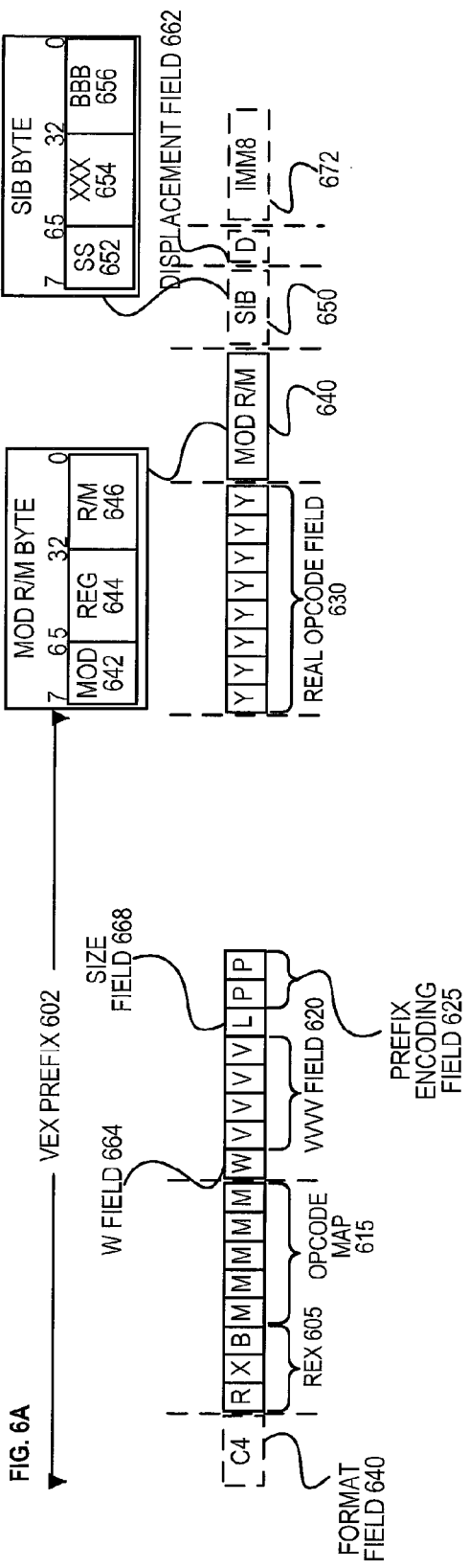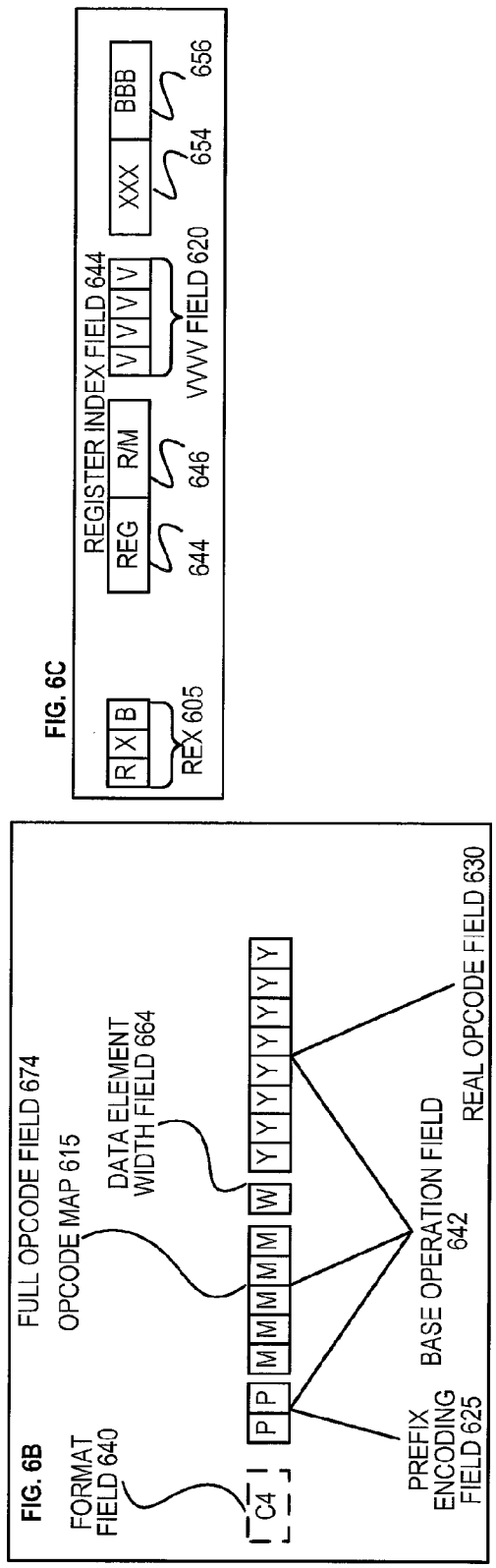

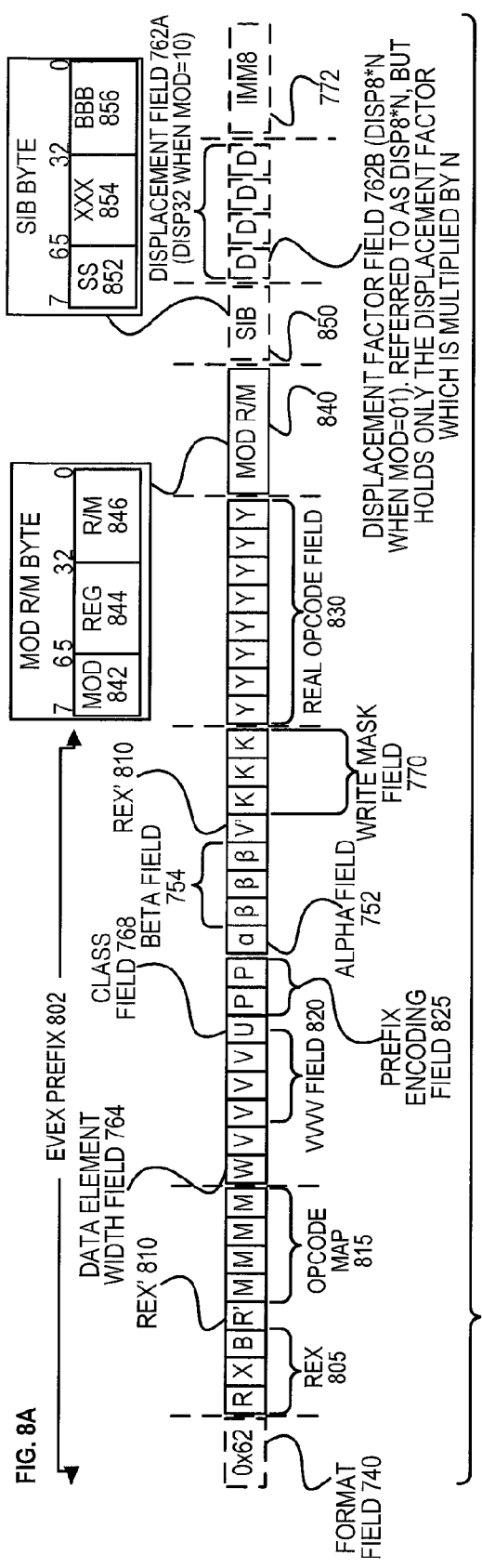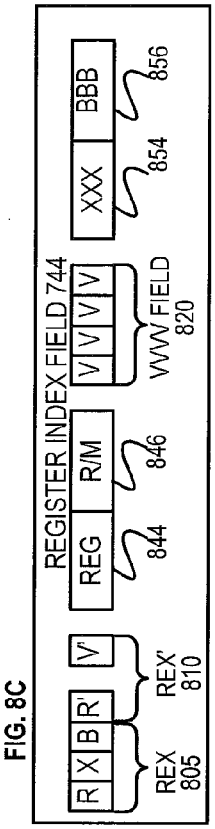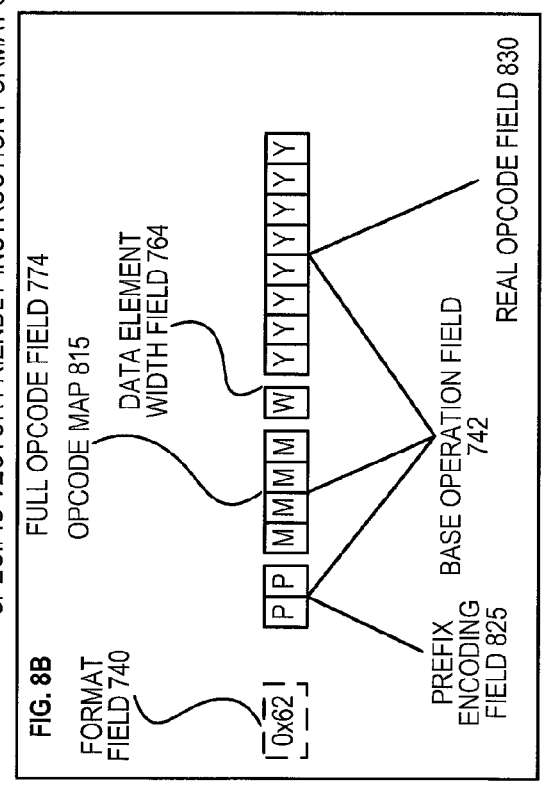

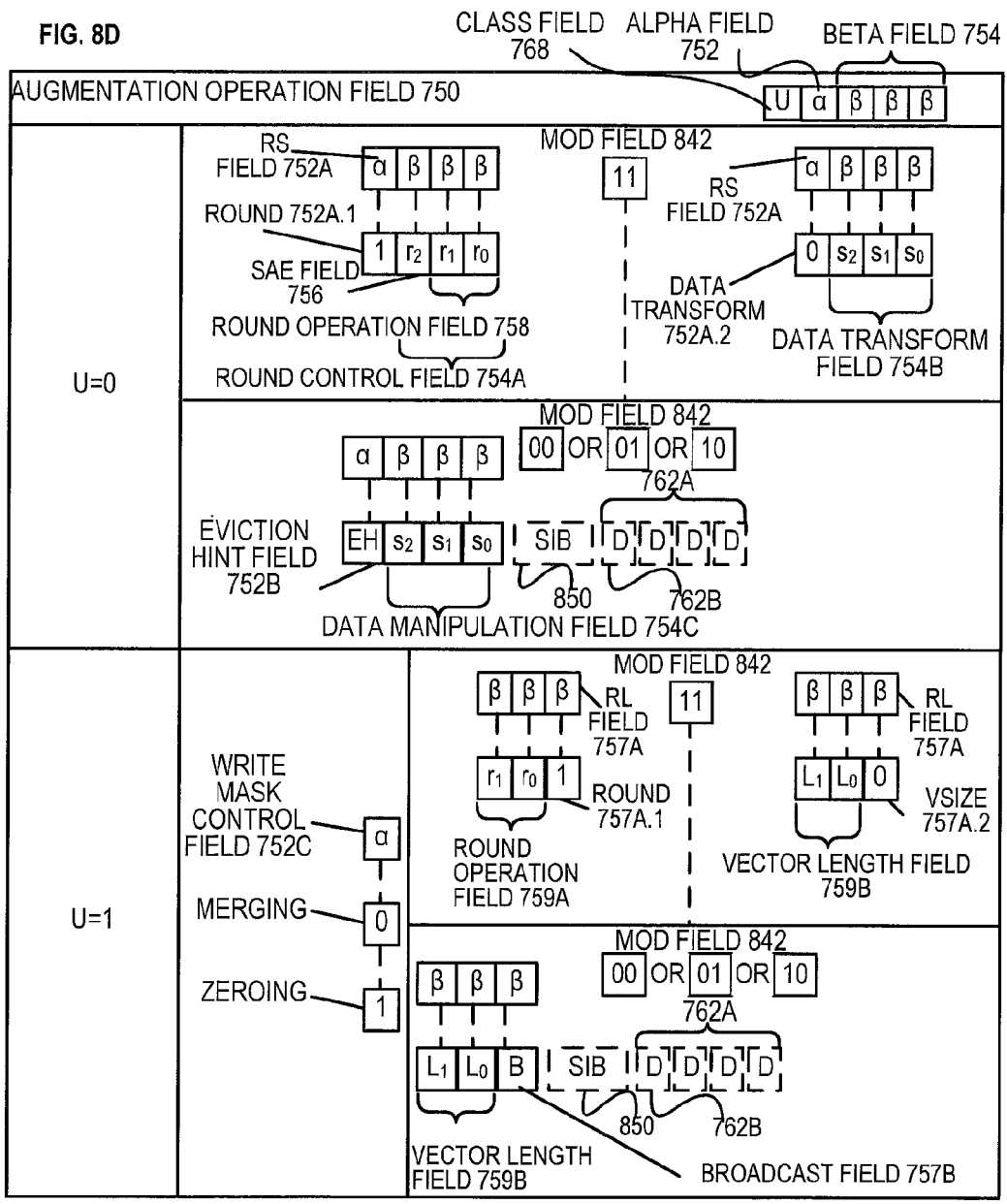

FIG. 9
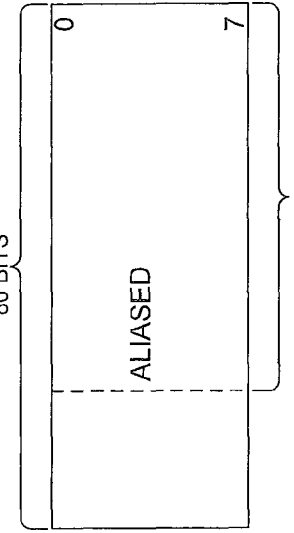
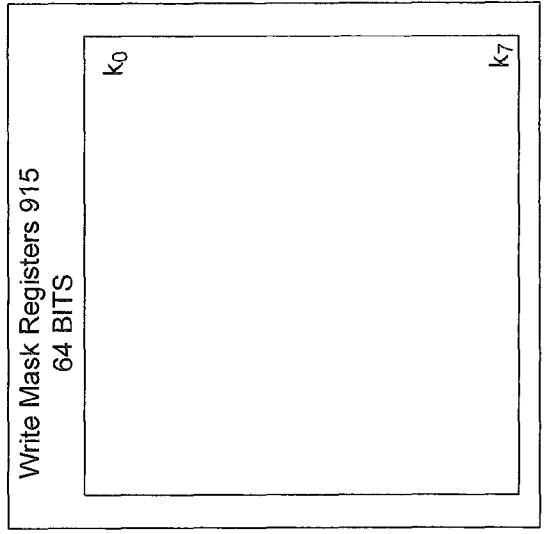
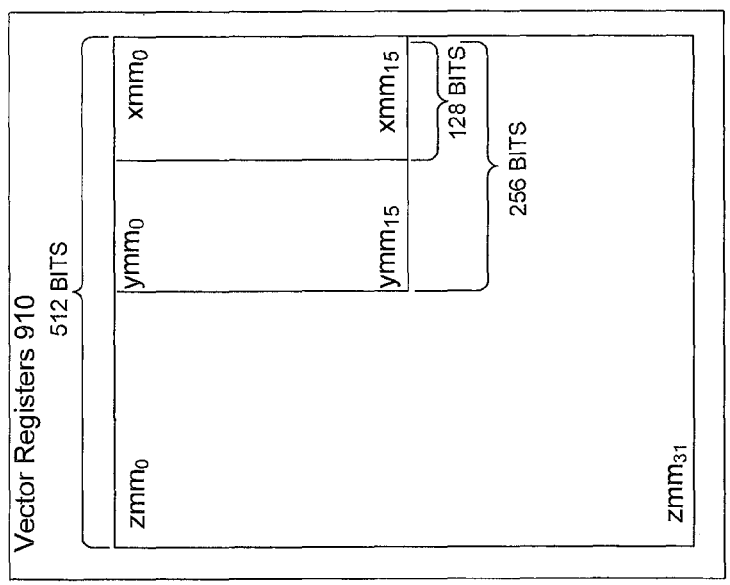

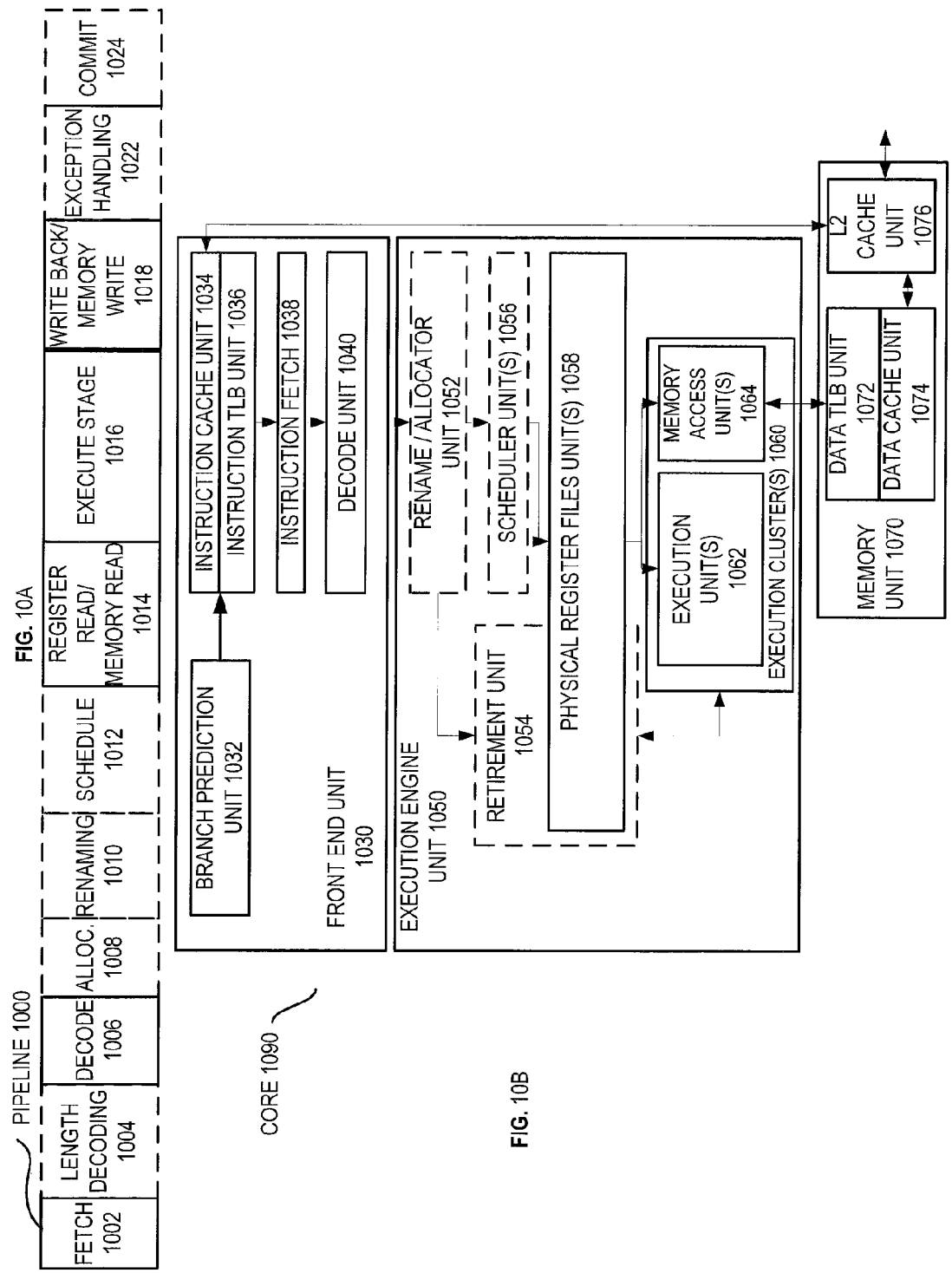

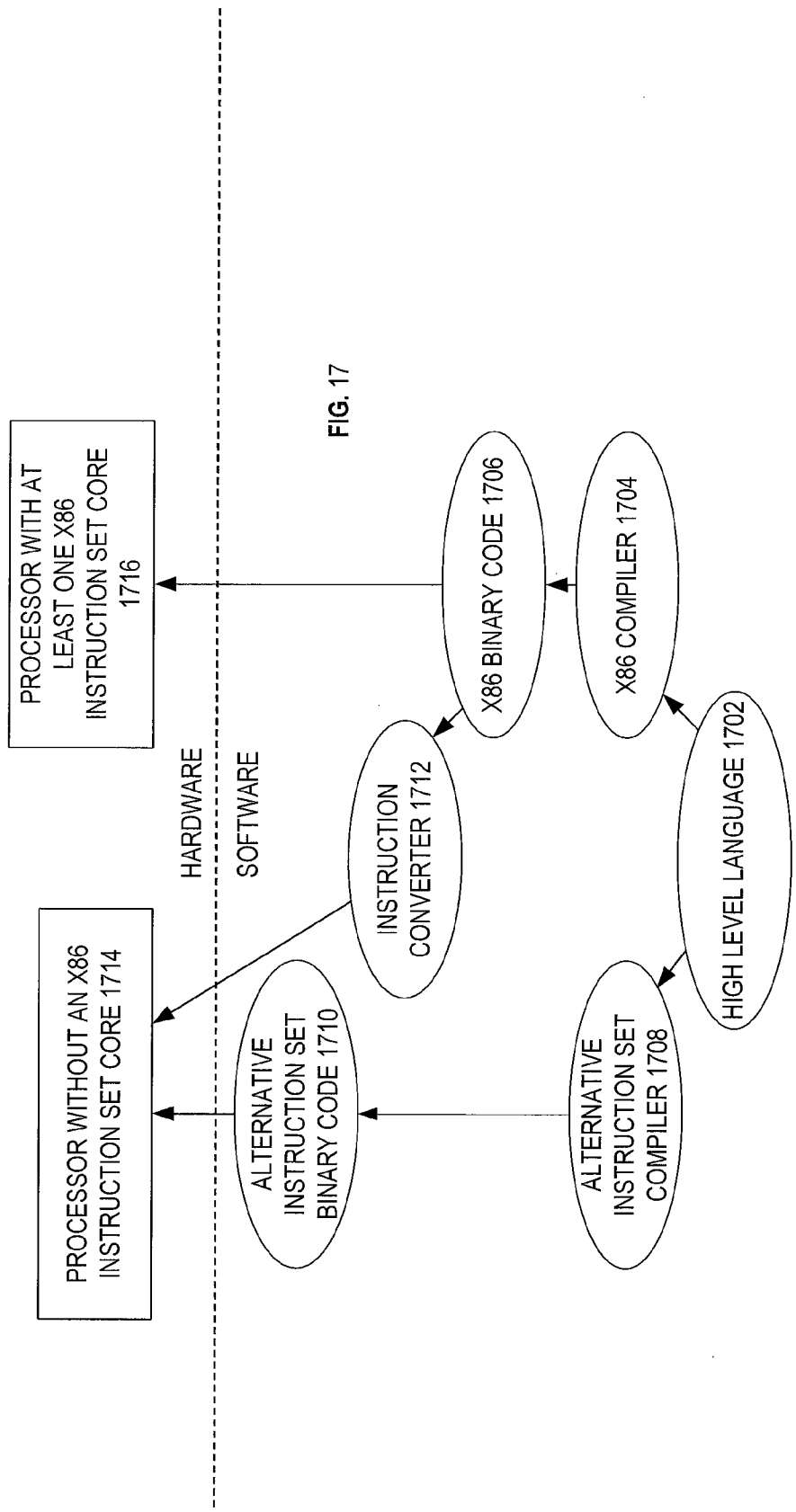

US 9,411,583 B2

VECTOR INSTRUCTION FOR PRESENTING COMPLEX CONJUGATES OF RESPECTIVE COMPLEX NUMBERS

CROSS-REFERENCE TO RELATED APPLICATION

This patent application is a U.S. National Phase Application under 35 U.S.C. §371 of International Application No. PCT/US2011/066995, filed Dec. 22, 2011, entitled VECTOR INSTRUCTION FOR PRESENTING COMPLEX CONJUGATES OF RESPECTIVE COMPLEX NUMBERS.

BACKGROUND

1. Field of Invention

The field of invention relates generally to the computing sciences and, more specifically, to a vector instruction for presenting complex conjugates of respective complex numbers.

2. Background

FIG. 1 shows a high level diagram of a processing core 100 implemented with logic circuitry on a semiconductor chip. The processing core includes a pipeline 101. The pipeline consists of multiple stages each designed to perform a specific step in the multi-step process needed to fully execute a program code instruction. These typically include at least: 1) instruction fetch and decode; 2) data fetch; 3) execution; 4) write-back. The execution stage performs a specific operation identified by an instruction that was fetched and decoded in prior stage(s) (e.g., in step 1) above) upon data identified by the same instruction and fetched in another prior stage (e.g., step 2) above). The data that is operated upon is typically fetched from (general purpose) register storage space 102. New data that is created at the completion of the operation is also typically "written back" to register storage space (e.g., at stage 4) above).

The logic circuitry associated with the execution stage is typically composed of multiple "execution units" or "functional units" 103_1 to 103_N that are each designed to perform its own unique subset of operations (e.g., a first functional unit performs integer math operations, a second functional unit performs floating point instructions, a third functional unit performs load/store operations from/to cache/memory, etc.). The collection of all operations performed by all the functional units corresponds to the "instruction set" supported by the processing core 100.

Two types of processor architectures are widely recognized in the field of computer science: "scalar" and "vector". A scalar processor is designed to execute instructions that perform operations on a single set of data, whereas, a vector processor is designed to execute instructions that perform operations on multiple sets of data. FIGS. 2A and 2B present a comparative example that demonstrates the basic difference between a scalar processor and a vector processor.

FIG. 2A shows an example of a scalar AND instruction in which a single operand set, A and B, are ANDed together to produce a singular (or "scalar") result C (i.e., AB=C). By contrast, FIG. 2B shows an example of a vector AND instruction in which two operand sets, A/B and D/E, are respectively ANDed together in parallel to simultaneously produce a vector result C, F (i.e., A.AND.B=C and D.AND.E=F). As a matter of terminology, a "vector" is a data element having multiple "elements". For example, a vector V=Q, R, S, T, U has five different elements: Q, R, S, T and U. The "size" of the exemplary vector V is five (because it has five elements).

Certain computational tasks are handled by modeling the information as "complex". A complex number is of the form "a+jb" where "a" is referred to as the "real" term and "b" is referred to as the "imaginary" term. The "complex conjugate" of a+jb takes the form of "a−jb"

BRIEF DESCRIPTION OF THE DRAWINGS

The present invention is illustrated by way of example and not limitation in the figures of the accompanying drawings, in which like references indicate similar elements and in which:

FIG. 6A illustrates an exemplary AVX instruction format;

FIG. 6B illustrates which fields from FIG. 6A make up a full opcode field and a base operation field;

FIG. 6C illustrates which fields from FIG. 6A make up a register index field;

FIGS. 8A-D are block diagrams illustrating an exemplary specific vector friendly instruction format according to embodiments of the invention;

FIG. 9 is a block diagram of a register architecture according to one embodiment of the invention;

FIG. 10A is a block diagram illustrating both an exemplary in-order pipeline and an exemplary register renaming, out-of-order issue/execution pipeline according to embodiments of the invention;

FIG. 10B is a block diagram illustrating both an exemplary embodiment of an in-order architecture core and an exemplary register renaming, out-of-order issue/execution architecture core to be included in a processor according to embodiments of the invention;

FIG. 17 is a block diagram contrasting the use of a software instruction converter to convert binary instructions in a source instruction set to binary instructions in a target instruction set according to embodiments of the invention.

DETAILED DESCRIPTION

Description

A number of computations that employ complex numbers seek to also employ the complex conjugates of those numbers. As discussed in the background, the complex conjugate of a+jb is a−jb. FIGS. 3a through 3f show the logical operation of different embodiments of a vector instruction that is designed to accept vector input information representing imaginary numbers and provide as the resultant the respective complex conjugates of the imaginary numbers.

Figure 1:
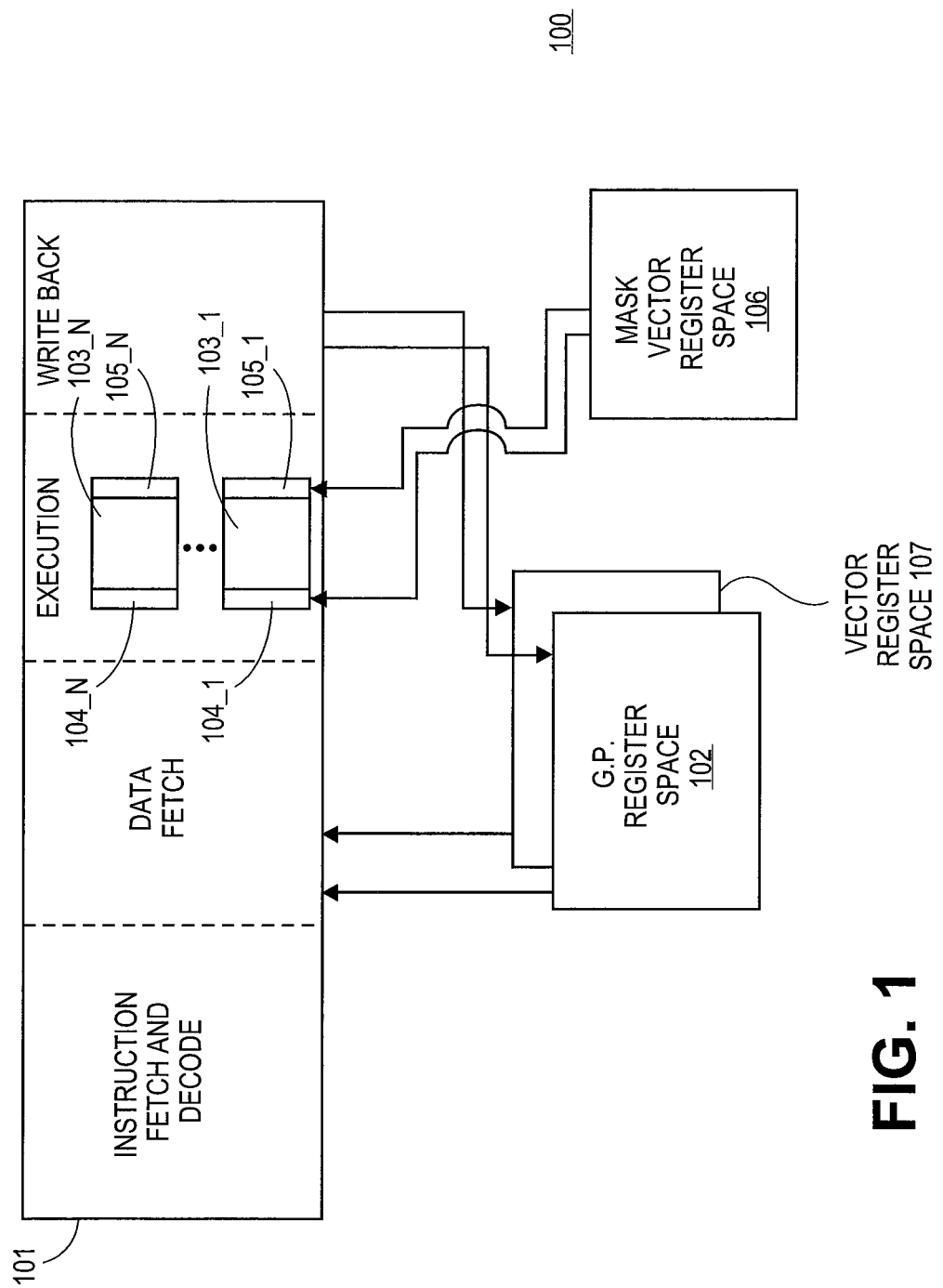
FIG. 1 shows an instruction execution pipeline.
Figure 2A:
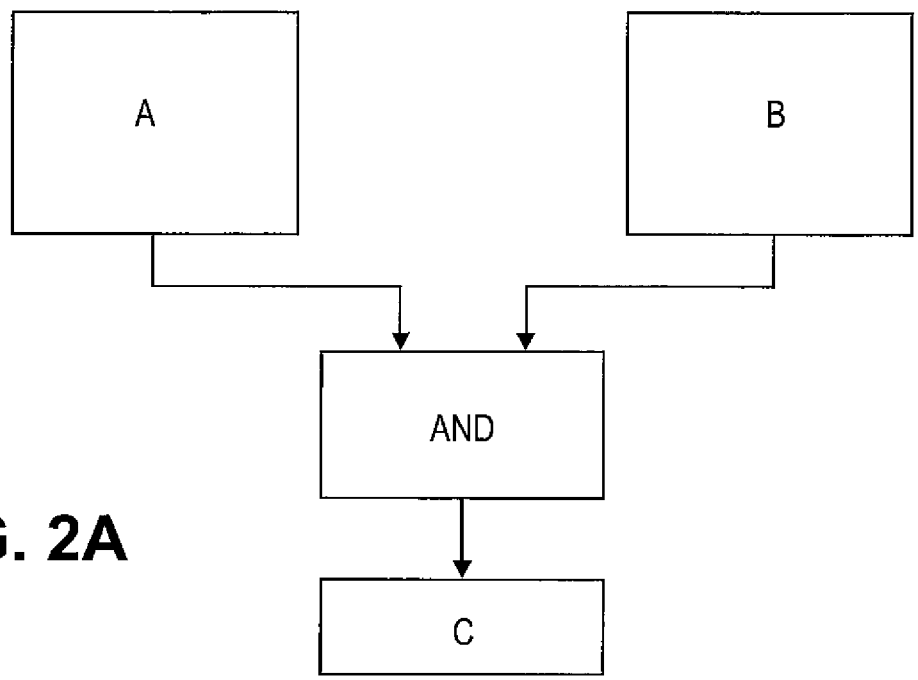
FIGS. 2a and 2b compare scalar vs. vector processing.
Figure 2B:
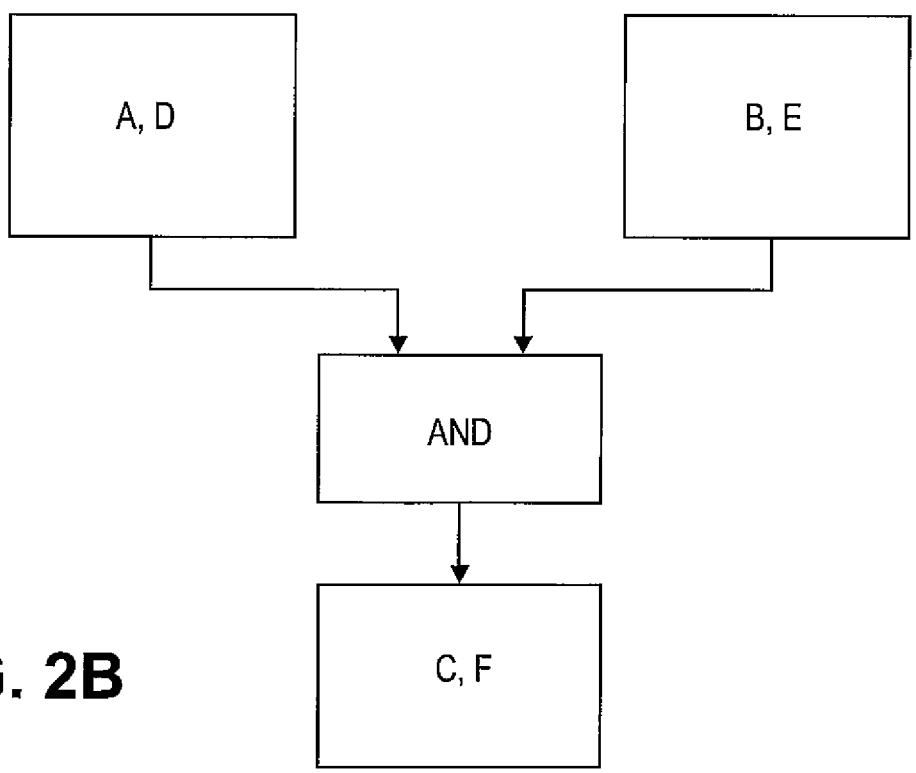
Figure 3A:
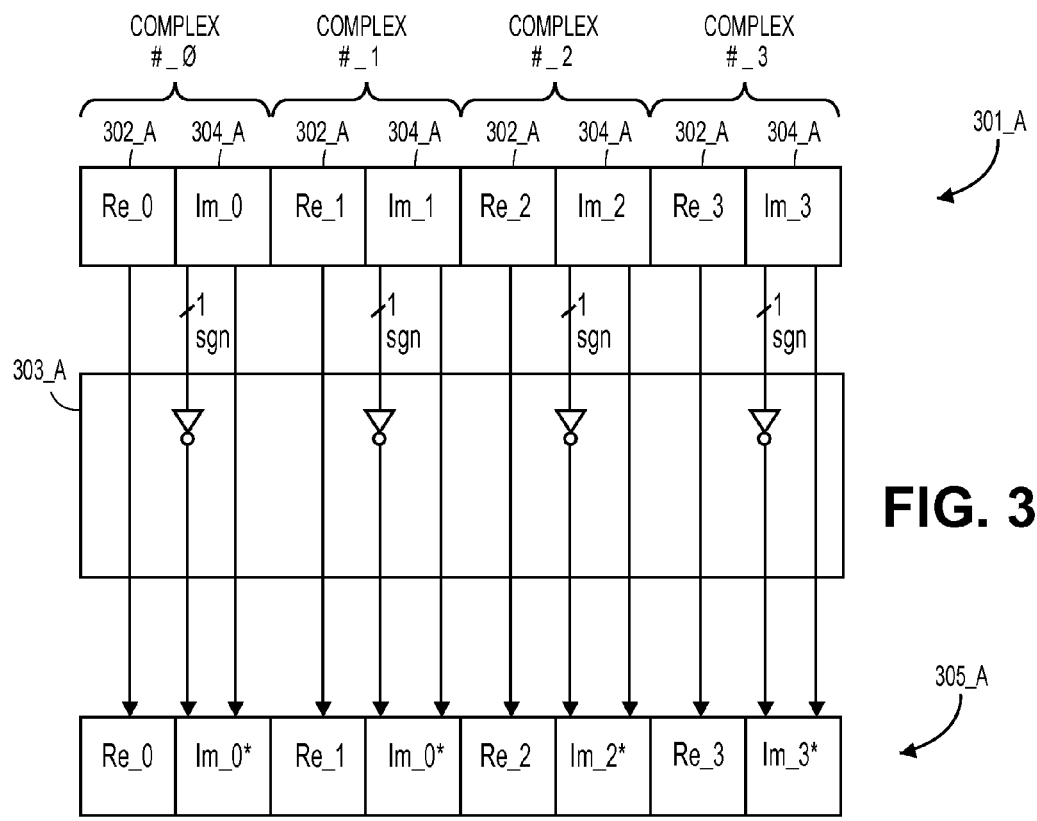
FIGS. 3a through 3f pertain to a vector instruction for presenting complex conjugates of respective complex numbers.

In the approach of FIG. 3a, the input vector 301_A is constructed such that the input complex numbers are packed with the real and imaginary terms of the same complex number being adjacent to one another within the input vector. As such, in order to return the respective complex conjugates, a first alternating group of input elements 302_A pass through the execution logic 303_A and a second alternating group of input elements 304_A exclusive from the first have their respective signs changed by the execution logic 303_A. As such the resultant 305_A consists of the input vector 301_A with alternating elements having a sign change.

In an embodiment, each input element is specified as a floating point value having both a mantissa term and an exponent term. The mantissa term includes a bit that specifies whether the number is positive or negative. In operation, logic 303_A changes the sign of input elements 304_A by flipping the value of each of their respective sign bits and not flipping the value of the respective sign bits of the other input elements 302_A.

Figure 3B:
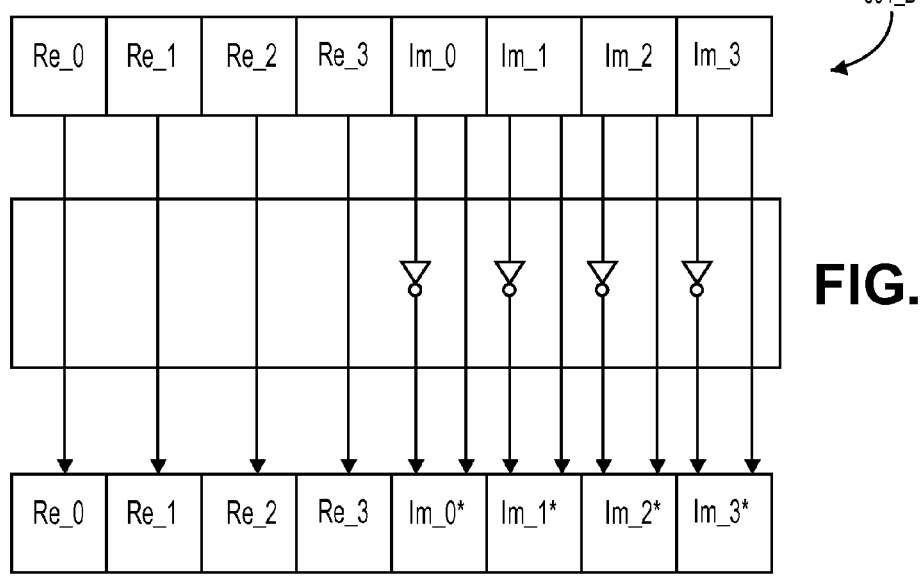

In the approach of FIG. 3b the input vector 301_B packs the real terms of the multiple complex numbers on one side of the input vector and the imaginary terms of the complex numbers of the other side of the input vector. As such, the imaginary terms have their signs changed as in the embodiment of FIG. 3a but according to a different pattern owing to the different input vector format.

Figure 3C:
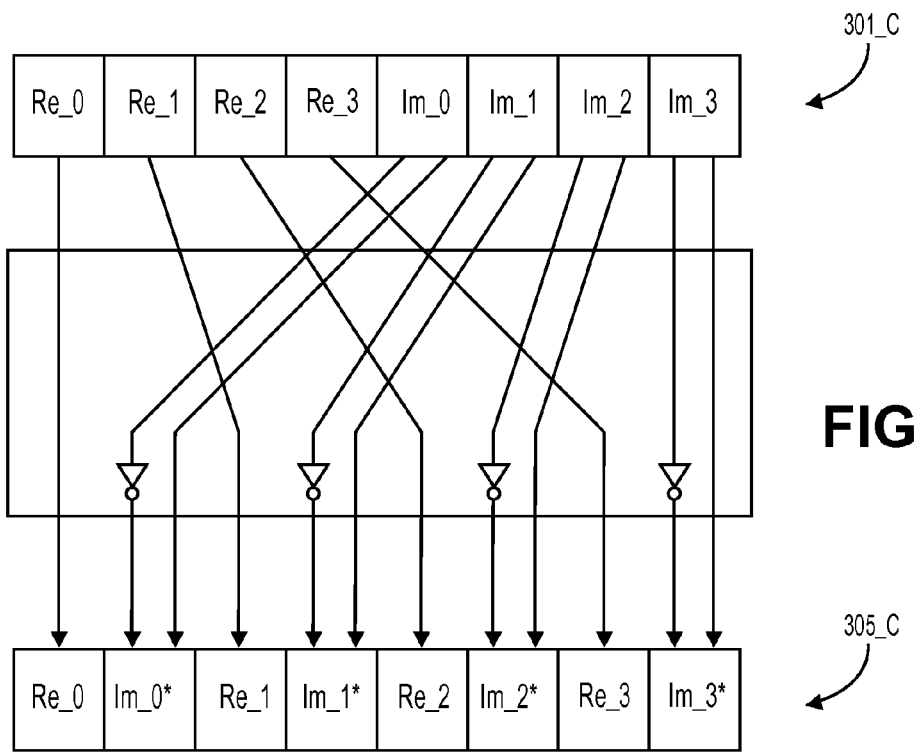

In the approach of FIG. 3c, the input vector 301_C takes the form of the approach of FIG. 3b but provides a resultant 305_C of the form of the FIG. 3a. As such, the execution logic 303_C permutes the input vector elements as well as changes signs of those of the elements that represent the imaginary part of a complex number.

Figure 3D:
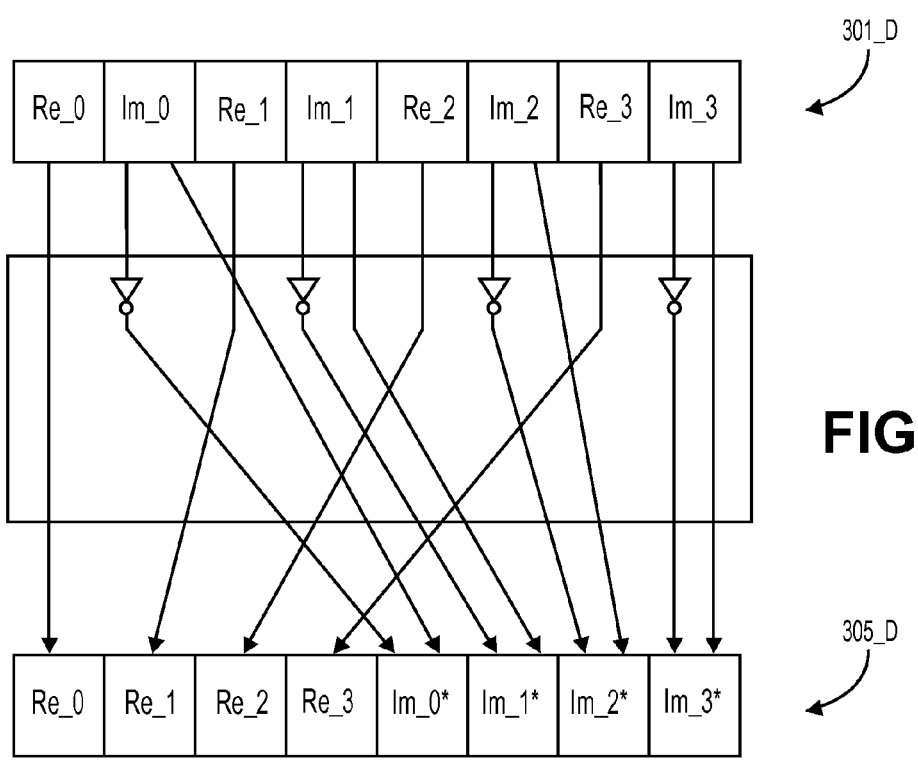

In the approach of FIG. 3d, the input vector 301_D takes the form of the approach of FIG. 3a but provides a resultant 305_D of the form of the FIG. 3b. As such, the execution logic 303_D permutes the input vector elements as well as changes signs of those of the elements that represent the imaginary part of a complex number.

Figure 3E:
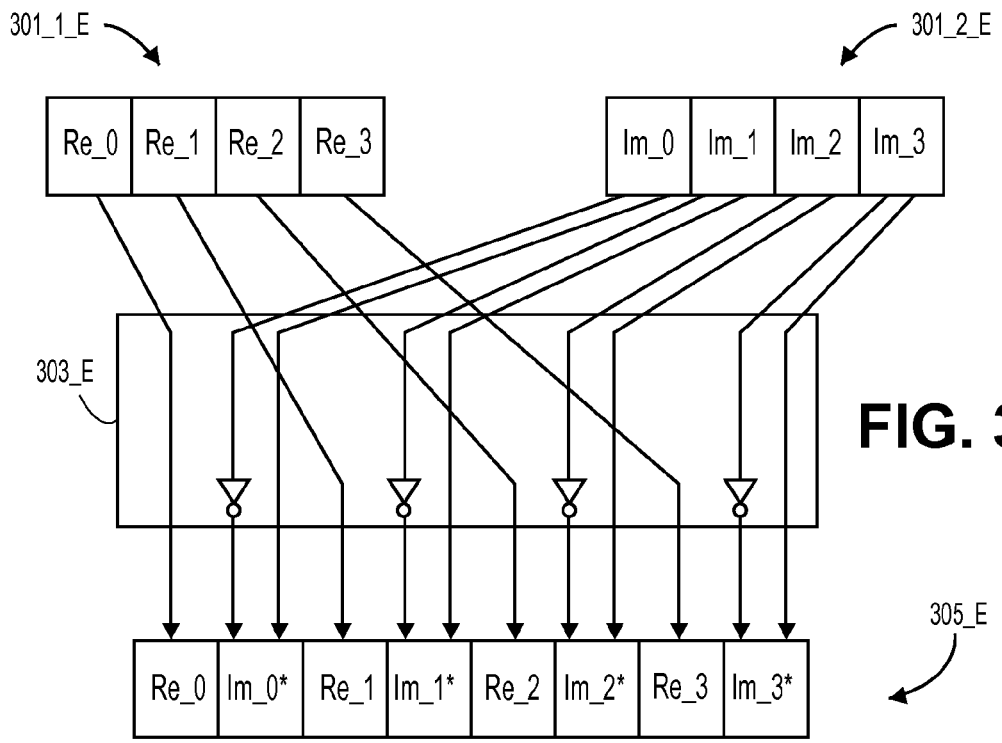

In the approach of FIG. 3e, a first input vector operand 301_1_E includes only real terms and a second input vector operand 301_2_E includes only the corresponding imaginary terms. Instruction execution logic 303_E merges the elements from both input operands and provides a resultant 305_E of the form of FIG. 3a. Here, note that the resultant vector 305_E size is twice that of each of the input vectors 301_1_E, 301_2_E.

Figure 3F:
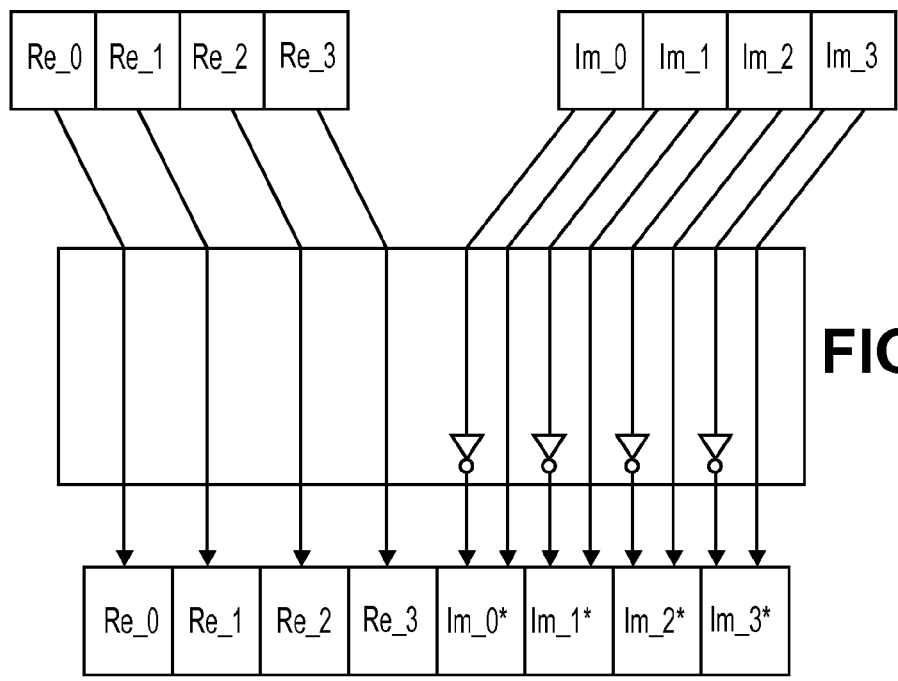

In the approach of FIG. 3f, the resultant 305_F takes the form of FIG. 3b. Other combinations are also possible (e.g., where the input is structured like FIG. 3A).

Figure 4:
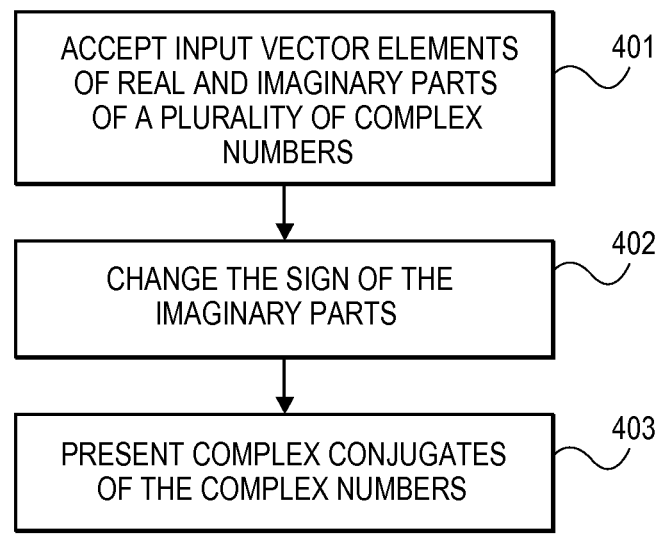
FIG. 4 pertains to a method performed by a vector instruction for presenting complex conjugates of respective complex numbers.

FIG. 4 shows a method performed by instruction execution logic circuitry that is designed to provide complex conjugates of input complex numbers. According to the methodology of FIG. 4, input vector elements corresponding to real and imaginary parts of a plurality of input complex numbers are received 401. The sign of the imaginary numbers are changed 402 and the real numbers and imaginary numbers with changed sign are presented as the resultant 403.

Figure 5A:
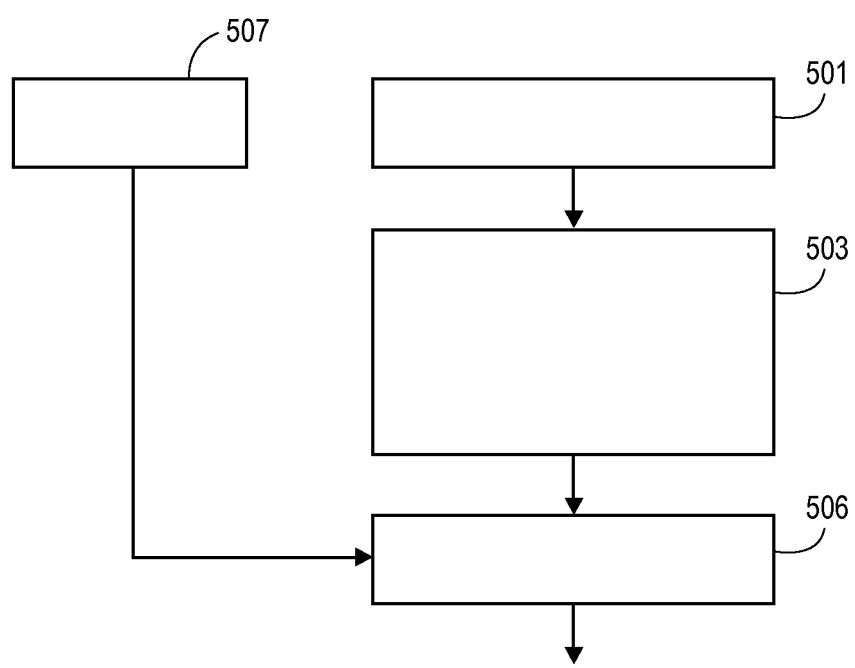
FIGS. 5a and 5b pertain to logic circuitry for a vector instruction for presenting complex conjugates of respective complex numbers.

FIG. 5a shows a first embodiment of logic circuitry of an execution unit that is designed to provide complex conjugates of input complex numbers. According to the design of FIG. 5, an input vector register 501 receives an input vector having real and imaginary terms of complex numbers. Register 501 may reside at any of: i) vector register space, ii) the output of a data fetch stage of an instruction execution pipeline; iii) the input of the execution unit.

In crafting a resultant, logic circuitry 503 changes the signs of the imaginary terms but does not change the signs of the ream terms. Logic circuitry 503 may also permute the various input elements to craft an output vector whose format of real and imaginary terms is different than the format of the input vector. The execution unit also includes write mask circuitry 506 that applies a write mask received from a mask register 507. Zero masking (masked elements are force fed a value of 0) or write through masking (masked elements retain their original value in the destination) may be employed. In an embodiment, the execution unit can receive and/or provide imaginary numbers in different formats. In a further embodiment, the format that applies to the input and/or output vector is specified in an immediate operand. In another embodiment, the format that applies is specified in the opcode (e.g., there are different opcodes for different input and/or output formats).

Figure 5B:
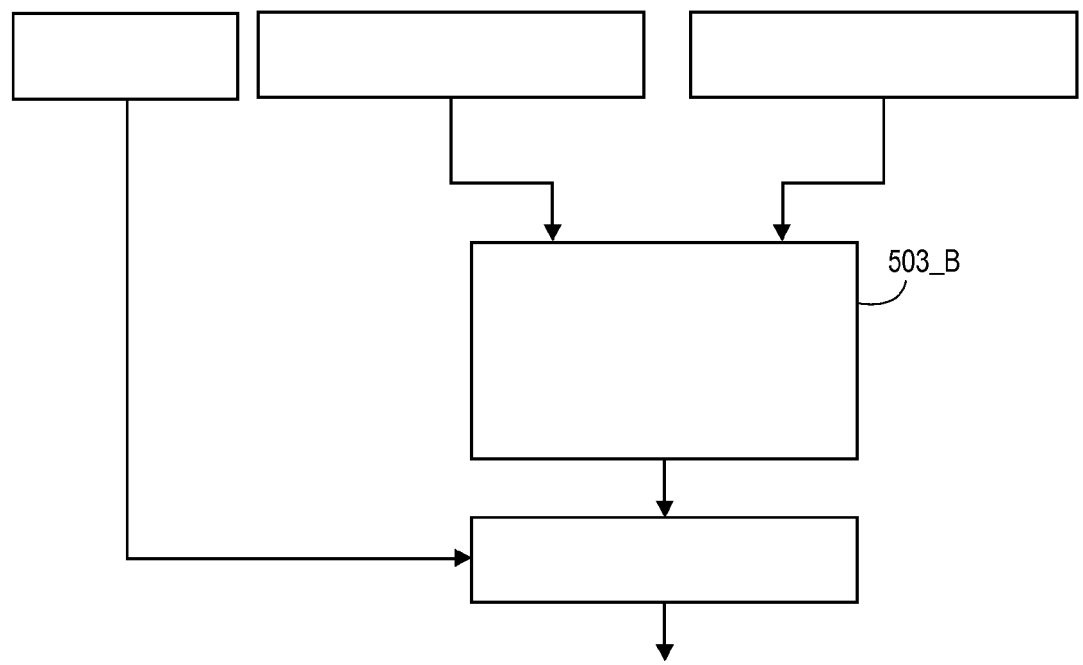

FIG. 5b shows a second embodiment of logic circuitry of an execution unit that is designed to provide complex conjugates of input complex numbers. The design of FIG. 5b is similar to that of FIG. 5a with the additional functionality that two input vectors are received. Here, the logic circuitry 503_B merges the input elements from the two different input vectors to form a single output vector (e.g., as observed in FIGS. 3e and 3f).

Exemplary Instruction Formats

Embodiments of the instruction(s) described herein may be embodied in different formats. For example, the instruction(s) described herein may be embodied as a VEX, generic vector friendly, or other format. Details of VEX and a generic vector friendly format are discussed below. Additionally, exemplary systems, architectures, and pipelines are detailed below. Embodiments of the instruction(s) may be executed on such systems, architectures, and pipelines, but are not limited to those detailed.

VEX Instruction Format

VEX encoding allows instructions to have more than two operands, and allows SIMD vector registers to be longer than 128 bits. The use of a VEX prefix provides for three-operand (or more) syntax. For example, previous two-operand instructions performed operations such as A=A+B, which overwrites a source operand. The use of a VEX prefix enables operands to perform nondestructive operations such as A=B+C.

FIG. 6A illustrates an exemplary AVX instruction format including a VEX prefix 602, real opcode field 630, Mod R/M byte 640, SIB byte 650, displacement field 662, and IMM8 672. FIG. 6B illustrates which fields from FIG. 6A make up a full opcode field 674 and a base operation field 642. FIG. 6C illustrates which fields from FIG. 6A make up a register index field 644.

VEX Prefix (Bytes 0-2) 602 is encoded in a three-byte form. The first byte is the Format Field 640 (VEX Byte 0, bits [7:0]), which contains an explicit C4 byte value (the unique value used for distinguishing the C4 instruction format). The second-third bytes (VEX Bytes 1-2) include a number of bit fields providing specific capability. Specifically, REX field 605 (VEX Byte 1, bits [7-5]) consists of a VEX.R bit field (VEX Byte 1, bit [7]—R), VEX.X bit field (VEX byte 1, bit [6]—X), and VEX.B bit field (VEX byte 1, bit[5]—B). Other fields of the instructions encode the lower three bits of the register indexes as is known in the art (rrr, xxx, and bbb), so that Rrrr, Xxxx, and Bbbb may be formed by adding VEX.R, VEX.X, and VEX.B. Opcode map field 615 (VEX byte 1, bits [4:0]—mmmmm) includes content to encode an implied leading opcode byte. W Field 664 (VEX byte 2, bit [7]—W)—is represented by the notation VEX.W, and provides different functions depending on the instruction. The role of VEX.vvvv 620 (VEX Byte 2, bits [6:3]—vvvv) may include the following: 1) VEX.vvvv encodes the first source register operand, specified in inverted (1s complement) form and is valid for instructions with 2 or more source operands; 2) VEX.vvvv encodes the destination register operand, specified in is complement form for certain vector shifts; or 3) VEX.vvvv does not encode any operand, the field is reserved and should contain 1111b. If VEX.L 668 Size field (VEX byte 2, bit [2]—L)=0, it indicates 128 bit vector; if VEX.L=1, it indicates 256 bit vector. Prefix encoding field 625 (VEX byte 2, bits [1:0]—pp) provides additional bits for the base operation field.

Real Opcode Field 630 (Byte 3) is also known as the opcode byte. Part of the opcode is specified in this field.

MOD R/M Field 640 (Byte 4) includes MOD field 642 (bits [7-6]), Reg field 644 (bits [5-3]), and R/M field 646 (bits [2-0]). The role of Reg field 644 may include the following: encoding either the destination register operand or a source register operand (the rrr of Rrrr), or be treated as an opcode extension and not used to encode any instruction operand. The role of R/M field 646 may include the following: encoding the instruction operand that references a memory address, or encoding either the destination register operand or a source register operand.

Scale, Index, Base (SIB)—The content of Scale field 650 (Byte 5) includes SS652 (bits [7-6]), which is used for memory address generation. The contents of SIB.xxx 654 (bits [5-3]) and SIB.bbb 656 (bits [2-0]) have been previously referred to with regard to the register indexes Xxxx and Bbbb.

The Displacement Field 662 and the immediate field (IMM8) 672 contain address data.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 7A:
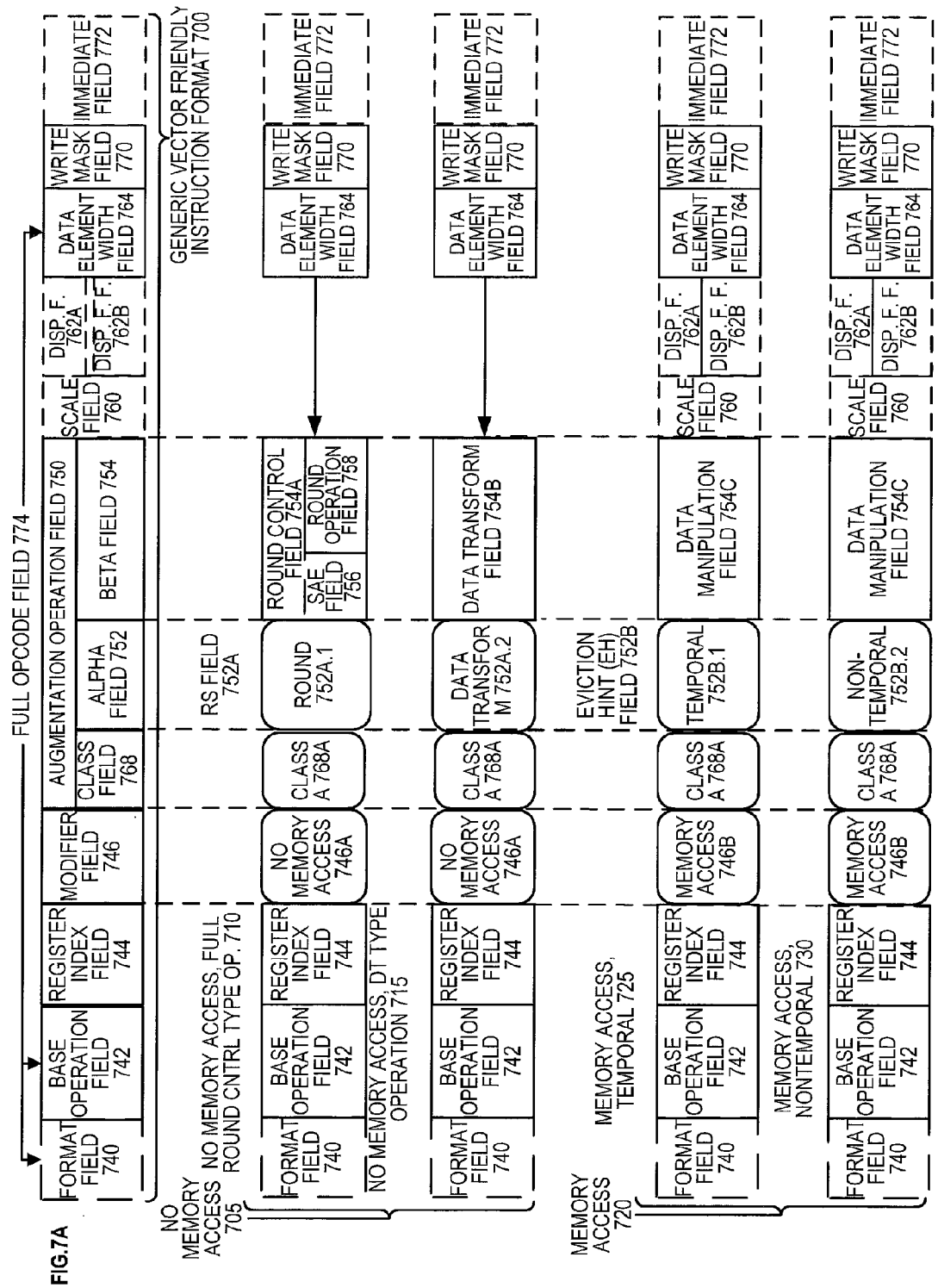
FIGS. 7A-7B are block diagrams illustrating a generic vector friendly instruction format and instruction templates thereof according to embodiments of the invention.
Figure 7B:
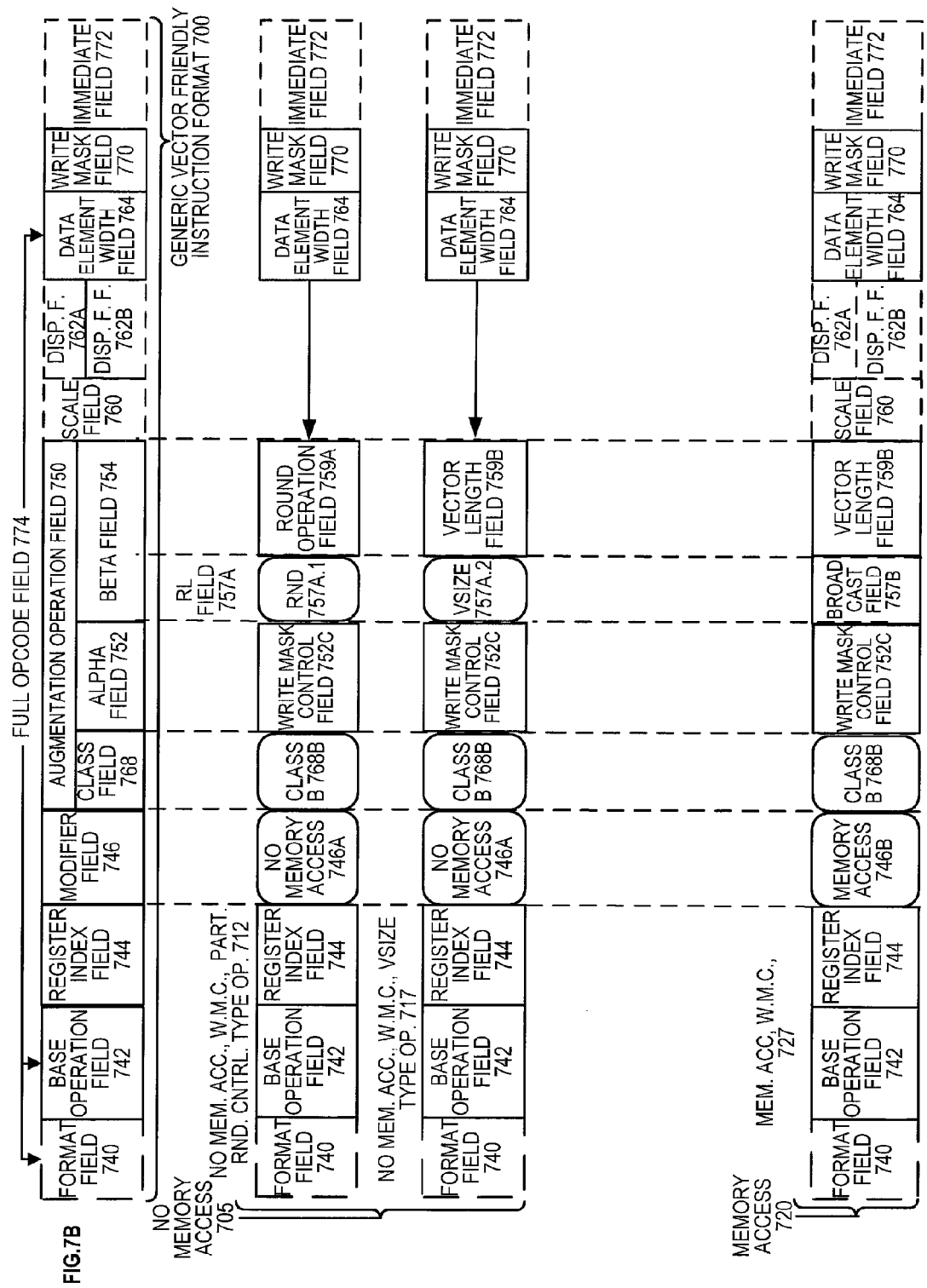

FIGS. 7A-7B are block diagrams illustrating a generic vector friendly instruction format and instruction templates thereof according to embodiments of the invention. FIG. 7A is a block diagram illustrating a generic vector friendly instruction format and class A instruction templates thereof according to embodiments of the invention; while FIG. 7B is a block diagram illustrating the generic vector friendly instruction format and class B instruction templates thereof according to embodiments of the invention. Specifically, a generic vector friendly instruction format 700 for which are defined class A and class B instruction templates, both of which include no memory access 705 instruction templates and memory access 720 instruction templates. The term generic in the context of the vector friendly instruction format refers to the instruction format not being tied to any specific instruction set.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 7A include: 1) within the no memory access 705 instruction templates there is shown a no memory access, full round control type operation 710 instruction template and a no memory access, data transform type operation 715 instruction template; and 2) within the memory access 720 instruction templates there is shown a memory access, temporal 725 instruction template and a memory access, non-temporal 730 instruction template. The class B instruction templates in FIG. 7B include: 1) within the no memory access 705 instruction templates there is shown a no memory access, write mask control, partial round control type operation 712 instruction template and a no memory access, write mask control, vsize type operation 717 instruction template; and 2) within the memory access 720 instruction templates there is shown a memory access, write mask control 727 instruction template.

The generic vector friendly instruction format 700 includes the following fields listed below in the order illustrated in FIGS. 7A-7B. In conjunction with the discussions above, in an embodiment, referring to the format details provided below in FIGS. 7A-B and 8, either a non memory access instruction type 705 or a memory access instruction type 720 may be utilized. Addresses for the read mask(s), input vector operand(s) and destination may be identified in register address field 744 described below. In a further embodiment, the write mask is specified in write mask field 770.

Format field 740—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 742—its content distinguishes different base operations.

Register index field 744—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 746—its content distinguishes occurrences of instructions in the generic vector instruction format that specify memory access from those that do not; that is, between no memory access 705 instruction templates and memory access 720 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 750—its content distinguishes which one of a variety of different operations to be performed in addition to the base operation. This field is context specific. In one embodiment of the invention, this field is divided into a class field 768, an alpha field 752, and a beta field 754. The augmentation operation field 750 allows common groups of operations to be performed in a single instruction rather than 2, 3, or 4 instructions.

Scale field 760—its content allows for the scaling of the index field's content for memory address generation (e.g., for address generation that uses $2^{scale}*\text{index}+\text{base}$).

Displacement Field 762A—its content is used as part of memory address generation (e.g., for address generation that uses $2^{scale}*\text{index}+\text{base}+\text{displacement}$).

Displacement Factor Field 762B (note that the juxtaposition of displacement field 762A directly over displacement factor field 762B indicates one or the other is used)—its content is used as part of address generation; it specifies a displacement factor that is to be scaled by the size of a memory access (N)—where N is the number of bytes in the memory access (e.g., for address generation that uses $2^{scale}*\text{index}+\text{base}+\text{scaled displacement}$). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 774 (described later herein) and the data manipulation field 754C. The displacement field 762A and the displacement factor field 762B are optional in the sense that they are not used for the no memory access 705 instruction templates and/or different embodiments may implement only one or none of the two.

Data element width field 764—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 770—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 770 allows for partial vector operations, including loads, stores, arithmetic, logical, etc. While embodiments of the invention are described in which the write mask field's 770 content selects one of a number of write mask registers that contains the write mask to be used (and thus the write mask field's 770 content indirectly identifies that masking to be performed), alternative embodiments instead or additional allow the mask write field's 770 content to directly specify the masking to be performed.

Immediate field 772—its content allows for the specification of an immediate. This field is optional in the sense that is it not present in an implementation of the generic vector friendly format that does not support immediate and it is not present in instructions that do not use an immediate.

Class field 768—its content distinguishes between different classes of instructions. With reference to FIGS. 7A-B, the contents of this field select between class A and class B instructions. In FIGS. 7A-B, rounded corner squares are used to indicate a specific value is present in a field (e.g., class A 768A and class B 768B for the class field 768 respectively in FIGS. 7A-B).

Instruction Templates of Class A

In the case of the non-memory access 705 instruction templates of class A, the alpha field 752 is interpreted as an RS field 752A, whose content distinguishes which one of the different augmentation operation types are to be performed (e.g., round 752A.1 and data transform 752A.2 are respectively specified for the no memory access, round type operation 710 and the no memory access, data transform type operation 715 instruction templates), while the beta field 754 distinguishes which of the operations of the specified type is to be performed. In the no memory access 705 instruction templates, the scale field 760, the displacement field 762A, and the displacement scale filed 762B are not present.

No-Memory Access Instruction Templates—Full Round Control Type Operation

In the no memory access full round control type operation 710 instruction template, the beta field 754 is interpreted as a round control field 754A, whose content(s) provide static rounding. While in the described embodiments of the invention the round control field 754A includes a suppress all floating point exceptions (SAE) field 756 and a round operation control field 758, alternative embodiments may support may encode both these concepts into the same field or only have one or the other of these concepts/fields (e.g., may have only the round operation control field 758).

SAE field 756—its content distinguishes whether or not to disable the exception event reporting; when the SAE field's 756 content indicates suppression is enabled, a given instruction does not report any kind of floating-point exception flag and does not raise any floating point exception handler.

Round operation control field 758—its content distinguishes which one of a group of rounding operations to perform (e.g., Round-up, Round-down, Round-towards-zero and Round-to-nearest). Thus, the round operation control field 758 allows for the changing of the rounding mode on a per instruction basis. In one embodiment of the invention where a processor includes a control register for specifying rounding modes, the round operation control field's 750 content overrides that register value.

No Memory Access Instruction Templates—Data Transform Type Operation

In the no memory access data transform type operation 715 instruction template, the beta field 754 is interpreted as a data transform field 754B, whose content distinguishes which one of a number of data transforms is to be performed (e.g., no data transform, swizzle, broadcast).

In the case of a memory access 720 instruction template of class A, the alpha field 752 is interpreted as an eviction hint field 752B, whose content distinguishes which one of the eviction hints is to be used (in FIG. 7A, temporal 752B.1 and non-temporal 752B.2 are respectively specified for the memory access, temporal 725 instruction template and the memory access, non-temporal 730 instruction template), while the beta field 754 is interpreted as a data manipulation field 754C, whose content distinguishes which one of a number of data manipulation operations (also known as primitives) is to be performed (e.g., no manipulation; broadcast; up conversion of a source; and down conversion of a destination). The memory access 720 instruction templates include the scale field 760, and optionally the displacement field 762A or the displacement scale field 762B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 752 is interpreted as a write mask control (Z) field 752C, whose content distinguishes whether the write masking controlled by the write mask field 770 should be a merging or a zeroing.

In the case of the non-memory access 705 instruction templates of class B, part of the beta field 754 is interpreted as an RL field 757A, whose content distinguishes which one of the different augmentation operation types are to be performed (e.g., round 757A.1 and vector length (VSIZE) 757A.2 are respectively specified for the no memory access, write mask control, partial round control type operation 712 instruction template and the no memory access, write mask control, VSIZE type operation 717 instruction template), while the rest of the beta field 754 distinguishes which of the operations of the specified type is to be performed. In the no memory access 705 instruction templates, the scale field 760, the displacement field 762A, and the displacement scale filed 762B are not present.

In the no memory access, write mask control, partial round control type operation 710 instruction template, the rest of the beta field 754 is interpreted as a round operation field 759A and exception event reporting is disabled (a given instruction does not report any kind of floating-point exception flag and does not raise any floating point exception handler).

Round operation control field 759A—just as round operation control field 758, its content distinguishes which one of a group of rounding operations to perform (e.g., Round-up, Round-down, Round-towards-zero and Round-to-nearest). Thus, the round operation control field 759A allows for the changing of the rounding mode on a per instruction basis. In one embodiment of the invention where a processor includes a control register for specifying rounding modes, the round operation control field's 750 content overrides that register value.

In the no memory access, write mask control, VSIZE type operation 717 instruction template, the rest of the beta field 754 is interpreted as a vector length field 759B, whose content distinguishes which one of a number of data vector lengths is to be performed on (e.g., 128, 256, or 512 byte).

In the case of a memory access 720 instruction template of class B, part of the beta field 754 is interpreted as a broadcast field 757B, whose content distinguishes whether or not the broadcast type data manipulation operation is to be performed, while the rest of the beta field 754 is interpreted the vector length field 759B. The memory access 720 instruction templates include the scale field 760, and optionally the displacement field 762A or the displacement scale field 762B.

With regard to the generic vector friendly instruction format 700, a full opcode field 774 is shown including the format field 740, the base operation field 742, and the data element width field 764. While one embodiment is shown where the full opcode field 774 includes all of these fields, the full opcode field 774 includes less than all of these fields in embodiments that do not support all of them. The full opcode field 774 provides the operation code (opcode).

The augmentation operation field 750, the data element width field 764, and the write mask field 770 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIGS. 8A-D are block diagrams illustrating an exemplary specific vector friendly instruction format according to embodiments of the invention. FIGS. 8A-D show a specific vector friendly instruction format 800 that is specific in the sense that it specifies the location, size, interpretation, and order of the fields, as well as values for some of those fields. The specific vector friendly instruction format 800 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIGS. 7A-B into which the fields from FIGS. 8A-D map are illustrated.

It should be understood that, although embodiments of the invention are described with reference to the specific vector friendly instruction format 800 in the context of the generic vector friendly instruction format 700 for illustrative purposes, the invention is not limited to the specific vector friendly instruction format 800 except where claimed. For example, the generic vector friendly instruction format 700 contemplates a variety of possible sizes for the various fields, while the specific vector friendly instruction format 800 is shown as having fields of specific sizes. By way of specific example, while the data element width field 764 is illustrated as a one bit field in the specific vector friendly instruction format 800, the invention is not so limited (that is, the generic vector friendly instruction format 700 contemplates other sizes of the data element width field 764).

The generic vector friendly instruction format 700 includes the following fields listed below in the order illustrated in FIG. 8A.

EVEX Prefix (Bytes 0-3) 802—is encoded in a four-byte form.

Format Field 740 (EVEX Byte 0, bits [7:0])—the first byte (EVEX Byte 0) is the format field 740 and it contains 0x62 (the unique value used for distinguishing the vector friendly instruction format in one embodiment of the invention).

The second-fourth bytes (EVEX Bytes 1-3) include a number of bit fields providing specific capability.

REX field 805 (EVEX Byte 1, bits [7-5])—consists of a EVEX.R bit field (EVEX Byte 1, bit [7]—R), EVEX.X bit field (EVEX byte 1, bit [6]—X), and 757BEX byte 1, bit[5]—B). The EVEX.R, EVEX.X, and EVEX.B bit fields provide the same functionality as the corresponding VEX bit fields, and are encoded using is complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 710—this is the first part of the REX' field 710 and is the EVEX.R' bit field (EVEX Byte 1, bit [4]—R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 815 (EVEX byte 1, bits [3:0]—mmmm)—its content encodes an implied leading opcode byte (0F, 0F 38, or 0F 3).

Data element width field 764 (EVEX byte 2, bit [7]—W)—is represented by the notation EVEX.W. EVEX.W is used to define the granularity (size) of the datatype (either 32-bit data elements or 64-bit data elements).

EVEX.vvvv 820 (EVEX Byte 2, bits [6:3]—vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 820 encodes the 4 low-order bits of the first source register specifier stored in inverted (1s complement) form. Depending on the instruction, an extra different EVEX bit field is used to extend the specifier size to 32 registers.

EVEX.U 768 Class field (EVEX byte 2, bit [2]—U)—If EVEX.0=0, it indicates class A or EVEX.U0; if EVEX.0=1, it indicates class B or EVEX.U1.

Prefix encoding field 825 (EVEX byte 2, bits [1:0]—pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 752 (EVEX byte 3, bit [7]—EH; also known as EVEX.EH, EVEX.rs, EVEX.RL, EVEX.write mask control, and EVEX.N; also illustrated with a)—as previously described, this field is context specific.

Beta field 754 (EVEX byte 3, bits [6:4]—SSS, also known as EVEX.$s_{2-0}$, EVEX.$r_{2-0}$, EVEX.rr1, EVEX.LL0, EVEX.LLB; also illustrated with βββ)—as previously described, this field is context specific.

REX' field 710—this is the remainder of the REX' field and is the EVEX.V' bit field (EVEX Byte 3, bit [3]—V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 770 (EVEX byte 3, bits [2:0]—kkk)—its content specifies the index of a register in the write mask registers as previously described. In one embodiment of the invention, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 830 (Byte 4) is also known as the opcode byte. Part of the opcode is specified in this field.

MOD R/M Field 840 (Byte 5) includes MOD field 842, Reg field 844, and R/M field 846. As previously described, the MOD field's 842 content distinguishes between memory access and non-memory access operations. The role of Reg field 844 can be summarized to two situations: encoding either the destination register operand or a source register operand, or be treated as an opcode extension and not used to encode any instruction operand. The role of R/M field 846 may include the following: encoding the instruction operand that references a memory address, or encoding either the destination register operand or a source register operand.

Scale, Index, Base (SIB) Byte (Byte 6)—As previously described, the scale field's 750 content is used for memory address generation. SIB.xxx 854 and SIB.bbb 856—the contents of these fields have been previously referred to with regard to the register indexes Xxxx and Bbbb.

Displacement field 762A (Bytes 7-10)—when MOD field 842 contains 10, bytes 7-10 are the displacement field 762A, and it works the same as the legacy 32-bit displacement (disp32) and works at byte granularity.

Displacement factor field 762B (Byte 7)—when MOD field 842 contains 01, byte 7 is the displacement factor field 762B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 762B is a reinterpretation of disp8; when using displacement factor field 762B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 762B substitutes the legacy x86 instruction set 8-bit displacement. Thus, the displacement factor field 762B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset).

Immediate field 772 operates as previously described.

Full Opcode Field

FIG. 8B is a block diagram illustrating the fields of the specific vector friendly instruction format 800 that make up the full opcode field 774 according to one embodiment of the invention. Specifically, the full opcode field 774 includes the format field 740, the base operation field 742, and the data element width (W) field 764. The base operation field 742 includes the prefix encoding field 825, the opcode map field 815, and the real opcode field 830.

Register Index Field

FIG. 8C is a block diagram illustrating the fields of the specific vector friendly instruction format 800 that make up the register index field 744 according to one embodiment of the invention. Specifically, the register index field 744 includes the REX field 805, the REX' field 810, the MODR/M.reg field 844, the MODR/M.r/m field 846, the VVVV field 820, xxx field 854, and the bbb field 856.

Augmentation Operation Field

FIG. 8D is a block diagram illustrating the fields of the specific vector friendly instruction format 800 that make up the augmentation operation field 750 according to one embodiment of the invention. When the class (U) field 768 contains 0, it signifies EVEX.U0 (class A 768A); when it contains 1, it signifies EVEX.U1 (class B 768B). When U=0 and the MOD field 842 contains 11 (signifying a no memory access operation), the alpha field 752 (EVEX byte 3, bit [7]—EH) is interpreted as the rs field 752A. When the rs field 752A contains a 1 (round 752A.1), the beta field 754 (EVEX byte 3, bits [6:4]—SSS) is interpreted as the round control field 754A. The round control field 754A includes a one bit SAE field 756 and a two bit round operation field 758. When the rs field 752A contains a 0 (data transform 752A.2), the beta field 754 (EVEX byte 3, bits [6:4]—SSS) is interpreted as a three bit data transform field 754B. When U=0 and the MOD field 842 contains 00, 01, or 10 (signifying a memory access operation), the alpha field 752 (EVEX byte 3, bit [7]—EH) is interpreted as the eviction hint (EH) field 752B and the beta field 754 (EVEX byte 3, bits [6:4]—SSS) is interpreted as a three bit data manipulation field 754C.

When U=1, the alpha field 752 (EVEX byte 3, bit [7]—EH) is interpreted as the write mask control (Z) field 752C. When U=1 and the MOD field 842 contains 11 (signifying a no memory access operation), part of the beta field 754 (EVEX byte 3, bit [4]—$S_0$) is interpreted as the RL field 757A; when it contains a 1 (round 757A.1) the rest of the beta field 754 (EVEX byte 3, bit [6-5]—$S_{2-1}$) is interpreted as the round operation field 759A, while when the RL field 757A contains a 0 (VSIZE 757.A2) the rest of the beta field 754 (EVEX byte 3, bit [6-5]—$S_{2-1}$) is interpreted as the vector length field 759B (EVEX byte 3, bit [6-5]—$L_{1-0}$). When U=1 and the MOD field 842 contains 00, 01, or 10 (signifying a memory access operation), the beta field 754 (EVEX byte 3, bits [6:4]—SSS) is interpreted as the vector length field 759B (EVEX byte 3, bit [6-5]—$L_{1-0}$) and the broadcast field 757B (EVEX byte 3, bit [4]—B).

Exemplary Register Architecture

FIG. 9 is a block diagram of a register architecture 900 according to one embodiment of the invention. In the embodiment illustrated, there are 32 vector registers 910 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 800 operates on these overlaid register file as illustrated in the below tables.

| Adjustable Vector Length | Class | Operations | Registers |
|---|---|---|---|
| Instruction Templates that do not include | A (FIG. 7A; U = 0) | 710, 715, 725, 730 | zmm registers (the vector length is |

| Adjustable Vector Length | Class | Operations | Registers |
|---|---|---|---|
| the vector length field 759B | B (FIG. 7B; U = 1) | 712 | 64 byte) zmm registers (the vector length is 64 byte) |
| Instruction Templates that do include the vector length field 759B | B (FIG. 7B; U = 1) | 717, 727 | zmm, ymm, or xmm registers (the vector length is 64 byte, 32 byte, or 16 byte) depending on the vector length field 759B |

In other words, the vector length field 759B selects between a maximum length and one or more other shorter lengths, where each such shorter length is half the length of the preceding length; and instructions templates without the vector length field 759B operate on the maximum vector length. Further, in one embodiment, the class B instruction templates of the specific vector friendly instruction format 800 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 915—in the embodiment illustrated, there are 8 write mask registers (k0 through k7), each 64 bits in size. In an alternate embodiment, the write mask registers 915 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 925—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 945, on which is aliased the MMX packed integer flat register file 950—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 10A is a block diagram illustrating both an exemplary in-order pipeline and an exemplary register renaming, out-of-order issue/execution pipeline according to embodiments of the invention. FIG. 10B is a block diagram illustrating both an exemplary embodiment of an in-order architecture core and an exemplary register renaming, out-of-order issue/execution architecture core to be included in a processor according to embodiments of the invention. The solid lined boxes in FIGS. 10A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 10A, a processor pipeline 1000 includes a fetch stage 1002, a length decode stage 1004, a decode stage 1006, an allocation stage 1008, a renaming stage 1010, a scheduling (also known as a dispatch or issue) stage 1012, a register read/memory read stage 1014, an execute stage 1016, a write back/memory write stage 1018, an exception handling stage 1022, and a commit stage 1024.

FIG. 10B shows processor core 1090 including a front end unit 1030 coupled to an execution engine unit 1050, and both are coupled to a memory unit 1070. The core 1090 may be a reduced instruction set computing (RISC) core, a complex instruction set computing (CISC) core, a very long instruction word (VLIW) core, or a hybrid or alternative core type. As yet another option, the core 1090 may be a special-purpose core, such as, for example, a network or communication core, compression engine, coprocessor core, general purpose computing graphics processing unit (GPGPU) core, graphics core, or the like.

The front end unit 1030 includes a branch prediction unit 1032 coupled to an instruction cache unit 1034, which is coupled to an instruction translation lookaside buffer (TLB) 1036, which is coupled to an instruction fetch unit 1038, which is coupled to a decode unit 1040. The decode unit 1040 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1040 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1090 includes a microcode ROM or other medium that stores microcode for certain macroinstructions (e.g., in decode unit 1040 or otherwise within the front end unit 1030). The decode unit 1040 is coupled to a rename/allocator unit 1052 in the execution engine unit 1050.

The execution engine unit 1050 includes the rename/allocator unit 1052 coupled to a retirement unit 1054 and a set of one or more scheduler unit(s) 1056. The scheduler unit(s) 1056 represents any number of different schedulers, including reservations stations, central instruction window, etc. The scheduler unit(s) 1056 is coupled to the physical register file(s) unit(s) 1058. Each of the physical register file(s) units 1058 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1058 comprises a vector registers unit, a write mask registers unit, and a scalar registers unit. These register units may provide architectural vector registers, vector mask registers, and general purpose registers. The physical register file(s) unit(s) 1058 is overlapped by the retirement unit 1054 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1054 and the physical register file(s) unit(s) 1058 are coupled to the execution cluster(s) 1060. The execution cluster(s) 1060 includes a set of one or more execution units 1062 and a set of one or more memory access units 1064. The execution units 1062 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1056, physical register file(s) unit(s) 1058, and execution cluster(s) 1060 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1064). It should also be understood that where separate pipelines are used, one or more of these pipelines may be out-of-order issue/execution and the rest in-order.

The set of memory access units 1064 is coupled to the memory unit 1070, which includes a data TLB unit 1072 coupled to a data cache unit 1074 coupled to a level 2 (L2) cache unit 1076. In one exemplary embodiment, the memory access units 1064 may include a load unit, a store address unit, and a store data unit, each of which is coupled to the data TLB unit 1072 in the memory unit 1070. The instruction cache unit 1034 is further coupled to a level 2 (L2) cache unit 1076 in the memory unit 1070. The L2 cache unit 1076 is coupled to one or more other levels of cache and eventually to a main memory.

By way of example, the exemplary register renaming, out-of-order issue/execution core architecture may implement the pipeline 1000 as follows: 1) the instruction fetch 1038 performs the fetch and length decoding stages 1002 and 1004; 2) the decode unit 1040 performs the decode stage 1006; 3) the rename/allocator unit 1052 performs the allocation stage 1008 and renaming stage 1010; 4) the scheduler unit(s) 1056 performs the schedule stage 1012; 5) the physical register file(s) unit(s) 1058 and the memory unit 1070 perform the register read/memory read stage 1014; the execution cluster 1060 perform the execute stage 1016; 6) the memory unit 1070 and the physical register file(s) unit(s) 1058 perform the write back/memory write stage 1018; 7) various units may be involved in the exception handling stage 1022; and 8) the retirement unit 1054 and the physical register file(s) unit(s) 1058 perform the commit stage 1024.

The core 1090 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1090 includes logic to support a packed data instruction set extension (e.g., AVX1, AVX2, and/or some form of the generic vector friendly instruction format (U=0 and/or U=1) previously described), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1034/1074 and a shared L2 cache unit 1076, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 11B:
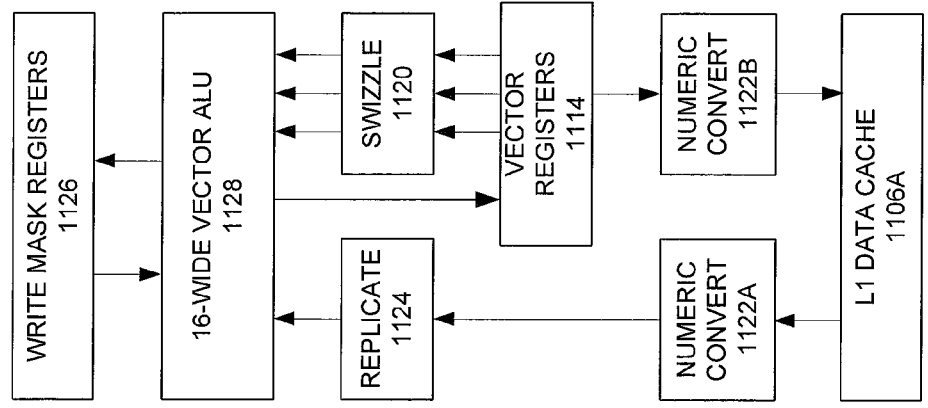
FIGS. 11A-B illustrate a block diagram of a more specific exemplary in-order core architecture, which core would be one of several logic blocks (including other cores of the same type and/or different types) in a chip.
Figure 11A:
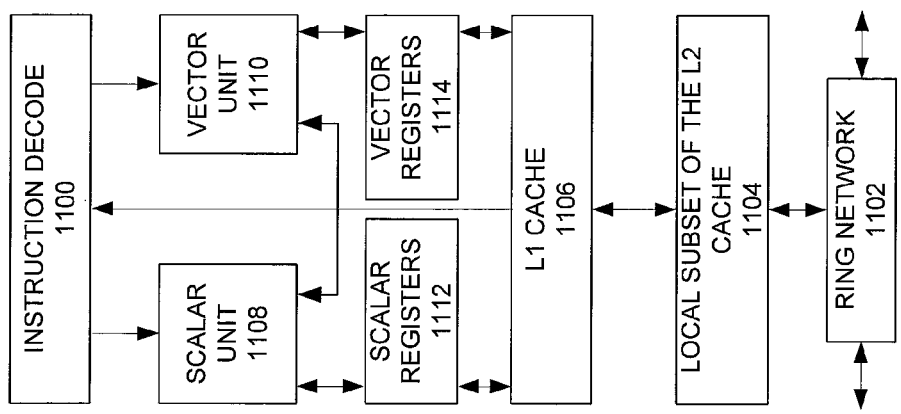

FIGS. 11A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 11A is a block diagram of a single processor core, along with its connection to the on-die interconnect network 1102 and with its local subset of the Level 2 (L2) cache 1104, according to embodiments of the invention. In one embodiment, an instruction decoder 1100 supports the x86 instruction set with a packed data instruction set extension. An L1 cache 1106 allows low-latency accesses to cache memory into the scalar and vector units. While in one embodiment (to simplify the design), a scalar unit 1108 and a vector unit 1110 use separate register sets (respectively, scalar registers 1112 and vector registers 1114) and data transferred between them is written to memory and then read back in from a level 1 (L1) cache 1106, alternative embodiments of the invention may use a different approach (e.g., use a single register set or include a communication path that allow data to be transferred between the two register files without being written and read back).

The local subset of the L2 cache 1104 is part of a global L2 cache that is divided into separate local subsets, one per processor core. Each processor core has a direct access path to its own local subset of the L2 cache 1104. Data read by a processor core is stored in its L2 cache subset 1104 and can be accessed quickly, in parallel with other processor cores accessing their own local L2 cache subsets. Data written by a processor core is stored in its own L2 cache subset 1104 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 11B is an expanded view of part of the processor core in FIG. 11A according to embodiments of the invention. FIG. 11B includes an L1 data cache 1106A part of the L1 cache 1104, as well as more detail regarding the vector unit 1110 and the vector registers 1114. Specifically, the vector unit 1110 is a 16-wide vector processing unit (VPU) (see the 16-wide ALU 1128), which executes one or more of integer, single-precision float, and double-precision float instructions. The VPU supports swizzling the register inputs with swizzle unit 1120, numeric conversion with numeric convert units 1122A-B, and replication with replication unit 1124 on the memory input. Write mask registers 1126 allow predicating resulting vector writes.

Processor with Integrated Memory Controller and Graphics

Figure 12:
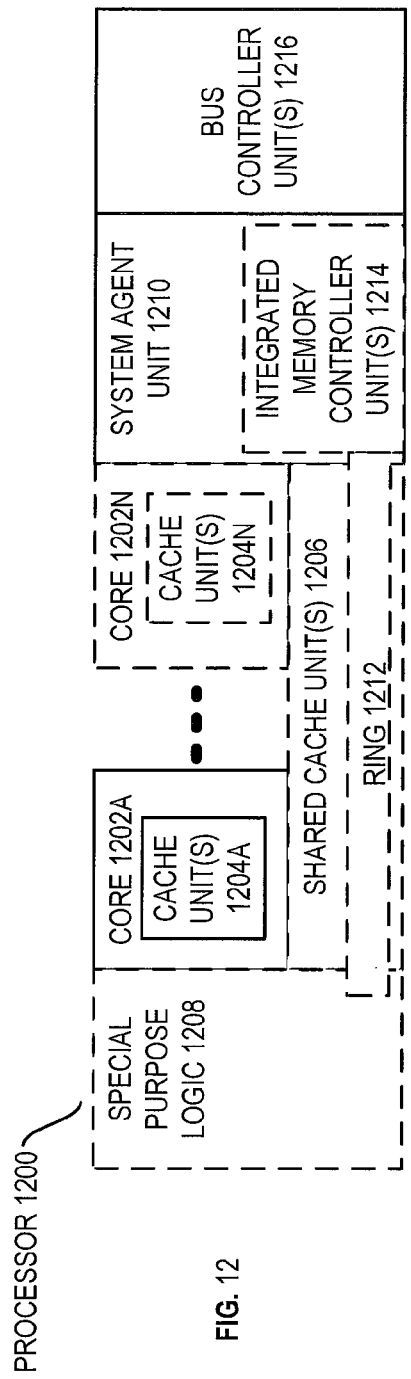
FIG. 12 is a block diagram of a processor that may have more than one core, may have an integrated memory controller, and may have integrated graphics according to embodiments of the invention.

FIG. 12 is a block diagram of a processor 1200 that may have more than one core, may have an integrated memory controller, and may have integrated graphics according to embodiments of the invention. The solid lined boxes in FIG. 12 illustrate a processor 1200 with a single core 1202A, a system agent 1210, a set of one or more bus controller units 1216, while the optional addition of the dashed lined boxes illustrates an alternative processor 1200 with multiple cores 1202A-N, a set of one or more integrated memory controller unit(s) 1214 in the system agent unit 1210, and special purpose logic 1208.

Thus, different implementations of the processor 1200 may include: 1) a CPU with the special purpose logic 1208 being integrated graphics and/or scientific (throughput) logic (which may include one or more cores), and the cores 1202A-N being one or more general purpose cores (e.g., general purpose in-order cores, general purpose out-of-order cores, a combination of the two); 2) a coprocessor with the cores 1202A-N being a large number of special purpose cores intended primarily for graphics and/or scientific (throughput); and 3) a coprocessor with the cores 1202A-N being a large number of general purpose in-order cores. Thus, the processor 1200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1206, and external memory (not shown) coupled to the set of integrated memory controller units 1214. The set of shared cache units 1206 may include one or more mid-level caches, such as level 2 (L2), level 3 (L3), level 4 (L4), or other levels of cache, a last level cache (LLC), and/or combinations thereof. While in one embodiment a ring based interconnect unit 1212 interconnects the integrated graphics logic 1208, the set of shared cache units 1206, and the system agent unit 1210/integrated memory controller unit(s) 1214, alternative embodiments may use any number of well-known techniques for interconnecting such units. In one embodiment, coherency is maintained between one or more cache units 1206 and cores 1202-A-N.

In some embodiments, one or more of the cores 1202A-N are capable of multi-threading. The system agent 1210 includes those components coordinating and operating cores 1202A-N. The system agent unit 1210 may include for example a power control unit (PCU) and a display unit. The PCU may be or include logic and components needed for regulating the power state of the cores 1202A-N and the integrated graphics logic 1208. The display unit is for driving one or more externally connected displays.

The cores 1202A-N may be homogenous or heterogeneous in terms of architecture instruction set; that is, two or more of the cores 1202A-N may be capable of execution the same instruction set, while others may be capable of executing only a subset of that instruction set or a different instruction set.

Exemplary Computer Architectures

FIGS. 13-16 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 13:
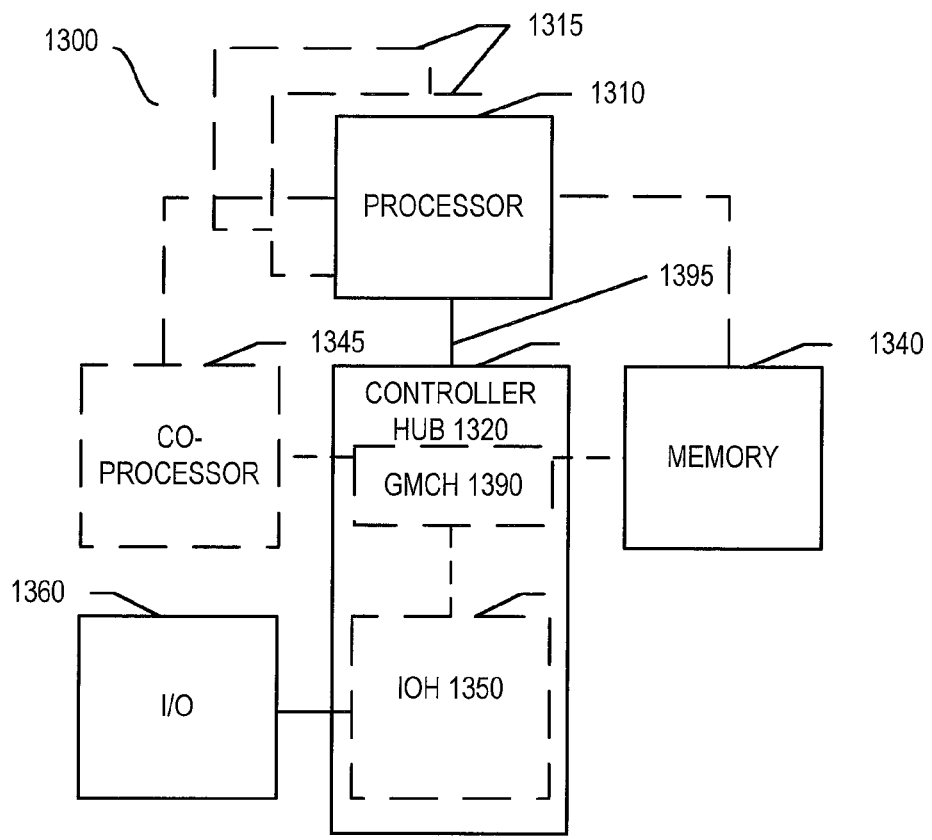
FIG. 13 is a block diagram of a exemplary system in accordance with an embodiment of the present invention.

Referring now to FIG. 13, shown is a block diagram of a system 1300 in accordance with one embodiment of the present invention. The system 1300 may include one or more processors 1310, 1315, which are coupled to a controller hub 1320. In one embodiment the controller hub 1320 includes a graphics memory controller hub (GMCH) 1390 and an Input/Output Hub (IOH) 1350 (which may be on separate chips); the GMCH 1390 includes memory and graphics controllers to which are coupled memory 1340 and a coprocessor 1345; the IOH 1350 is couples input/output (I/O) devices 1360 to the GMCH 1390. Alternatively, one or both of the memory and graphics controllers are integrated within the processor (as described herein), the memory 1340 and the coprocessor 1345 are coupled directly to the processor 1310, and the controller hub 1320 in a single chip with the IOH 1350.

The optional nature of additional processors 1315 is denoted in FIG. 13 with broken lines. Each processor 1310, 1315 may include one or more of the processing cores described herein and may be some version of the processor 1200.

The memory 1340 may be, for example, dynamic random access memory (DRAM), phase change memory (PCM), or a combination of the two. For at least one embodiment, the controller hub 1320 communicates with the processor(s) 1310, 1315 via a multi-drop bus, such as a frontside bus (FSB), point-to-point interface such as QuickPath Interconnect (QPI), or similar connection 1395.

In one embodiment, the coprocessor 1345 is a special-purpose processor, such as, for example, a high-throughput MIC processor, a network or communication processor, compression engine, graphics processor, GPGPU, embedded processor, or the like. In one embodiment, controller hub 1320 may include an integrated graphics accelerator.

There can be a variety of differences between the physical resources 1310, 1315 in terms of a spectrum of metrics of merit including architectural, microarchitectural, thermal, power consumption characteristics, and the like.

In one embodiment, the processor 1310 executes instructions that control data processing operations of a general type. Embedded within the instructions may be coprocessor instructions. The processor 1310 recognizes these coprocessor instructions as being of a type that should be executed by the attached coprocessor 1345. Accordingly, the processor 1310 issues these coprocessor instructions (or control signals representing coprocessor instructions) on a coprocessor bus or other interconnect, to coprocessor 1345. Coprocessor(s) 1345 accept and execute the received coprocessor instructions.

Figure 14:
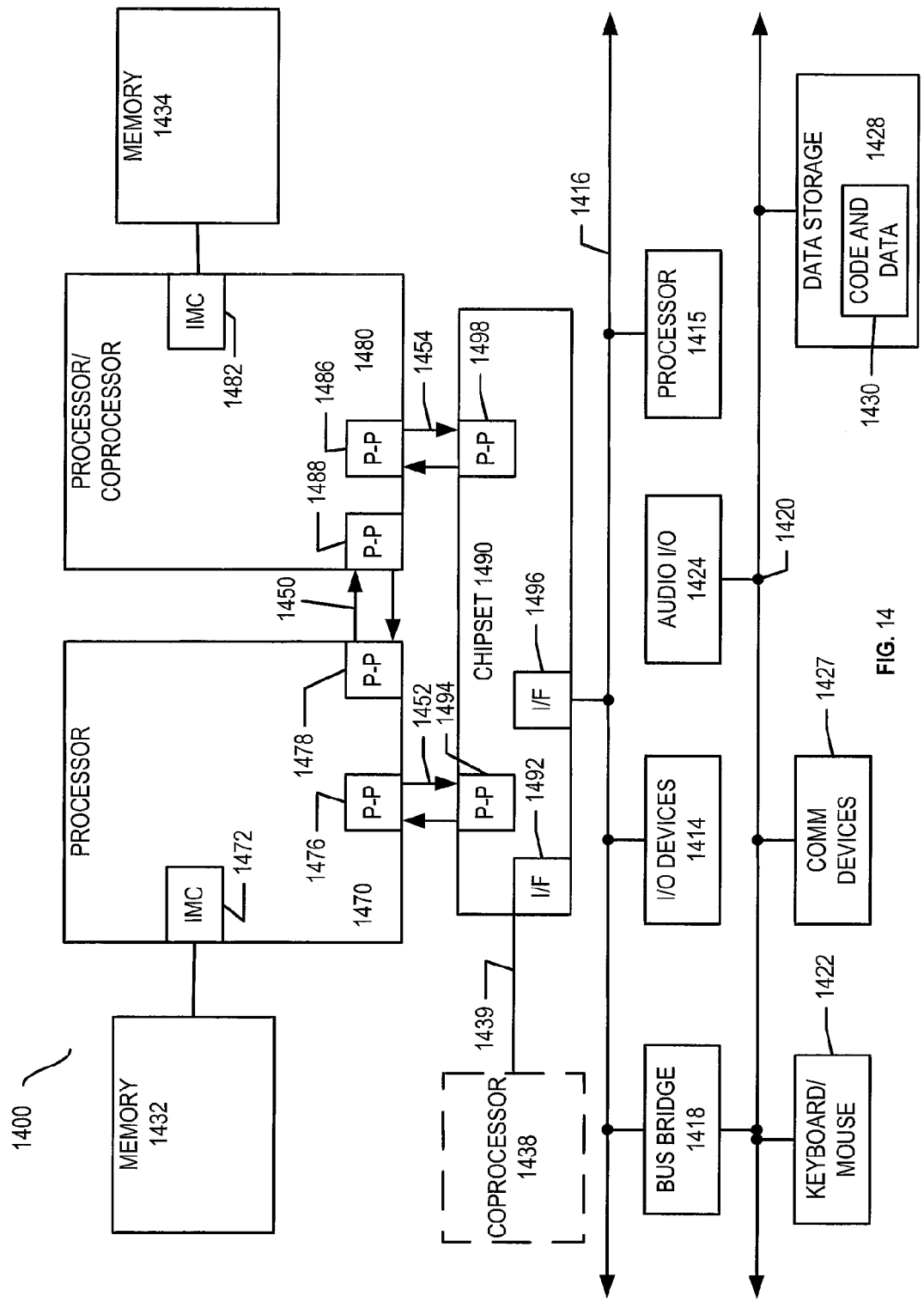
FIG. 14 is a block diagram of a first more specific exemplary system in accordance with an embodiment of the present invention.

Referring now to FIG. 14, shown is a block diagram of a first more specific exemplary system 1400 in accordance with an embodiment of the present invention. As shown in FIG. 14, multiprocessor system 1400 is a point-to-point interconnect system, and includes a first processor 1470 and a second processor 1480 coupled via a point-to-point interconnect 1450. Each of processors 1470 and 1480 may be some version of the processor 1200. In one embodiment of the invention, processors 1470 and 1480 are respectively processors 1310 and 1315, while coprocessor 1438 is coprocessor 1345. In another embodiment, processors 1470 and 1480 are respectively processor 1310 coprocessor 1345.

Processors 1470 and 1480 are shown including integrated memory controller (IMC) units 1472 and 1482, respectively. Processor 1470 also includes as part of its bus controller units point-to-point (P-P) interfaces 1476 and 1478; similarly, second processor 1480 includes P-P interfaces 1486 and 1488. Processors 1470, 1480 may exchange information via a point-to-point (P-P) interface 1450 using P-P interface circuits 1478, 1488. As shown in FIG. 14, IMCs 1472 and 1482 couple the processors to respective memories, namely a memory 1432 and a memory 1434, which may be portions of main memory locally attached to the respective processors.

Processors 1470, 1480 may each exchange information with a chipset 1490 via individual P-P interfaces 1452, 1454 using point to point interface circuits 1476, 1494, 1486, 1498. Chipset 1490 may optionally exchange information with the coprocessor 1438 via a high-performance interface 1439. In one embodiment, the coprocessor 1438 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1490 may be coupled to a first bus 1416 via an interface 1496. In one embodiment, first bus 1416 may be a Peripheral Component Interconnect (PCI) bus, or a bus such as a PCI Express bus or another third generation I/O interconnect bus, although the scope of the present invention is not so limited.

As shown in FIG. 14, various I/O devices 1414 may be coupled to first bus 1416, along with a bus bridge 1418 which couples first bus 1416 to a second bus 1420. In one embodiment, one or more additional processor(s) 1415, such as coprocessors, high-throughput MIC processors, GPGPU's, accelerators (such as, e.g., graphics accelerators or digital signal processing (DSP) units), field programmable gate arrays, or any other processor, are coupled to first bus 1416. In one embodiment, second bus 1420 may be a low pin count (LPC) bus. Various devices may be coupled to a second bus 1420 including, for example, a keyboard and/or mouse 1422, communication devices 1427 and a storage unit 1428 such as a disk drive or other mass storage device which may include instructions/code and data 1430, in one embodiment.

Further, an audio I/O 1424 may be coupled to the second bus 1420. Note that other architectures are possible. For example, instead of the point-to-point architecture of FIG. 14, a system may implement a multi-drop bus or other such architecture.

Figure 15:
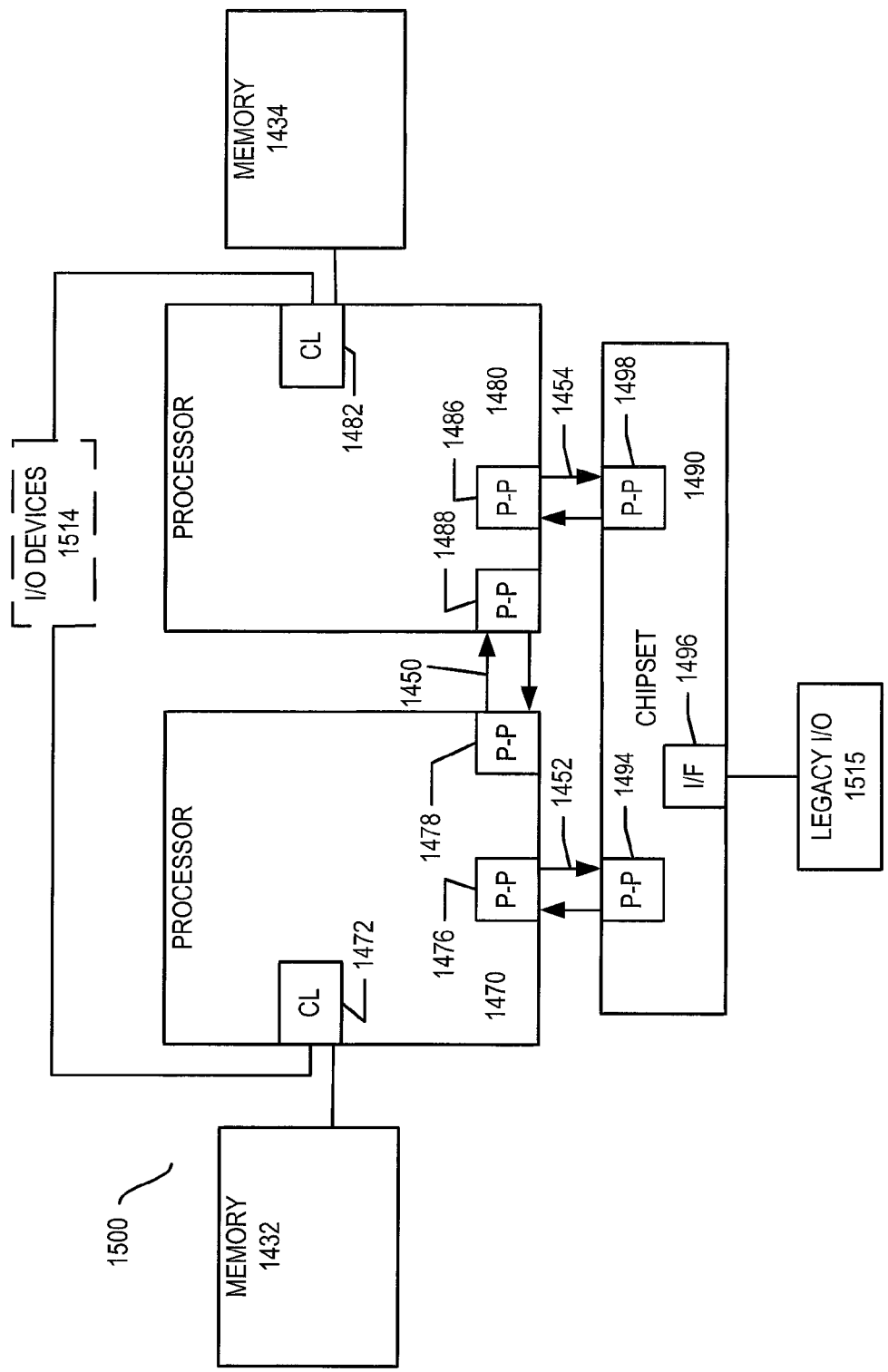
FIG. 15 is a block diagram of a second more specific exemplary system in accordance with an embodiment of the present invention.

Referring now to FIG. 15, shown is a block diagram of a second more specific exemplary system 1500 in accordance with an embodiment of the present invention Like elements in FIGS. 14 and 15 bear like reference numerals, and certain aspects of FIG. 14 have been omitted from FIG. 15 in order to avoid obscuring other aspects of FIG. 15.

FIG. 15 illustrates that the processors 1470, 1480 may include integrated memory and I/O control logic ("CL") 1472 and 1482, respectively. Thus, the CL 1472, 1482 include integrated memory controller units and include I/O control logic. FIG. 15 illustrates that not only are the memories 1432, 1434 coupled to the CL 1472, 1482, but also that I/O devices 1514 are also coupled to the control logic 1472, 1482. Legacy I/O devices 1515 are coupled to the chipset 1490.

Figure 16:
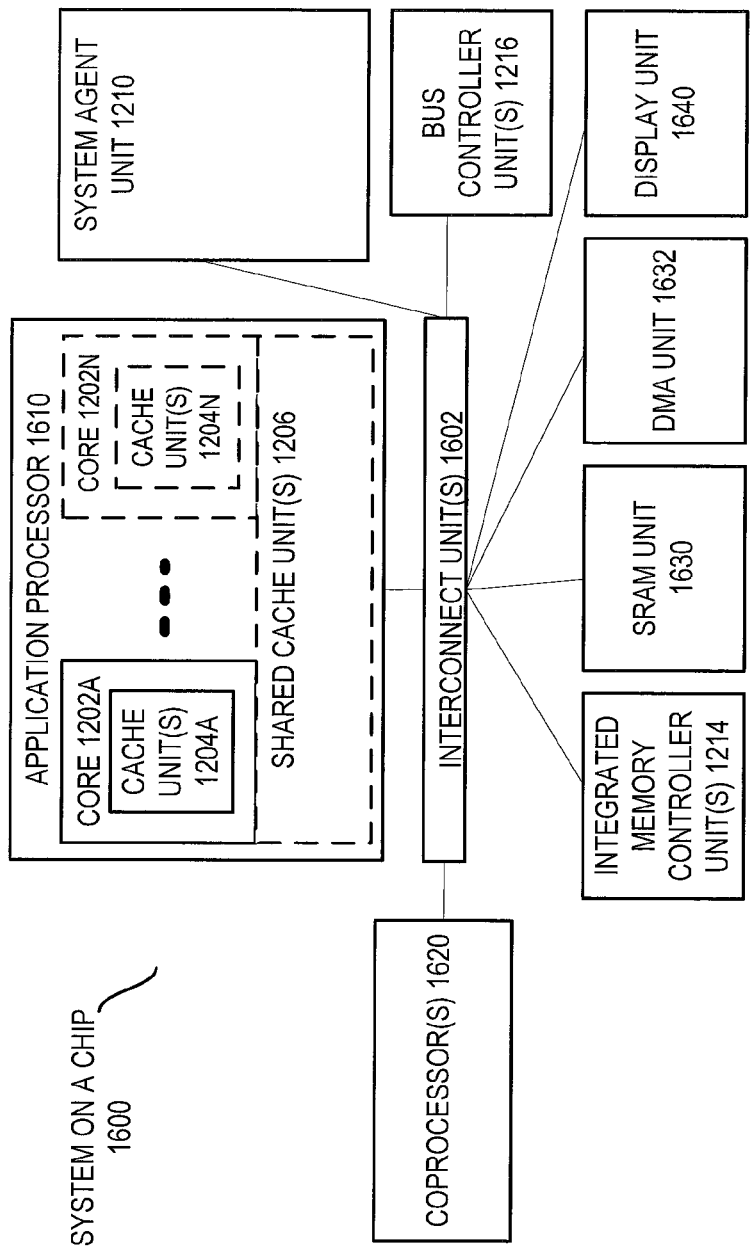
FIG. 16 is a block diagram of a SoC in accordance with an embodiment of the present invention.

Referring now to FIG. 16, shown is a block diagram of a SoC 1600 in accordance with an embodiment of the present invention. Similar elements in FIG. 12 bear like reference numerals. Also, dashed lined boxes are optional features on more advanced SoCs. In FIG. 16, an interconnect unit(s) 1602 is coupled to: an application processor 1610 which includes a set of one or more cores 202A-N and shared cache unit(s) 1206; a system agent unit 1210; a bus controller unit(s) 1216; an integrated memory controller unit(s) 1214; a set or one or more coprocessors 1620 which may include integrated graphics logic, an image processor, an audio processor, and a video processor; an static random access memory (SRAM) unit 1630; a direct memory access (DMA) unit 1632; and a display unit 1640 for coupling to one or more external displays. In one embodiment, the coprocessor(s) 1620 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1430 illustrated in FIG. 14, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 17 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 17 shows a program in a high level language 1702 may be compiled using an x86 compiler 1704 to generate x86 binary code 1706 that may be natively executed by a processor with at least one x86 instruction set core 1716. The processor with at least one x86 instruction set core 1716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1704 represents a compiler that is operable to generate x86 binary code 1706 (e.g., object code) that can, with or without additional linkage processing, be executed on the processor with at least one x86 instruction set core 1716. Similarly, FIG. 17 shows the program in the high level language 1702 may be compiled using an alternative instruction set compiler 1708 to generate alternative instruction set binary code 1710 that may be natively executed by a processor without at least one x86 instruction set core 1714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1712 is used to convert the x86 binary code 1706 into code that may be natively executed by the processor without an x86 instruction set core 1714. This converted code is not likely to be the same as the alternative instruction set binary code 1710 because an instruction converter capable of this is difficult to make; however, the converted code will accomplish the general operation and be made up of instructions from the alternative instruction set. Thus, the instruction converter 1712 represents software, firmware, hardware, or a combination thereof that, through emulation, simulation or any other process, allows a processor or other electronic device that does not have an x86 instruction set processor or core to execute the x86 binary code 1706.

What is claimed is:

1. An apparatus comprising:
   a semiconductor chip having an instruction execution pipeline, said instruction execution pipeline having an execution unit to perform the following for an instruction:
   accept input vector elements representing real and imaginary parts of a plurality of complex numbers; and
   present complex conjugates of said complex numbers, wherein the execution unit supports presenting the complex conjugates for a plurality of input vector formats that differ as to which input vector elements correspond to real parts and which input vector elements correspond to imaginary parts.

2. The apparatus of claim 1 wherein said execution unit includes write mask circuitry.

3. The apparatus of claim 1 wherein the complex conjugates are not rounded.

4. The apparatus of claim 1 wherein said instruction has a format that specifies through an immediate operand which input vector format applies.

5. The apparatus of claim 1 wherein said execution unit supports presenting the complex conjugates in a plurality of output vector formats that differ as to which output vector elements correspond to real parts and which output vector elements correspond to imaginary parts.

6. The apparatus of claim 1 wherein said execution unit is to permute said input vector elements.

7. A method comprising:
performing the following by executing an instruction with an execution unit:
accepting input vector elements representing real and imaginary parts of a plurality of complex numbers; and
creating complex conjugates of said complex numbers, wherein the execution unit supports presenting the complex conjugates for a plurality of input vector formats that differ as to which input vector elements correspond to real parts and which input vector elements correspond to imaginary parts.

8. The method of claim 7 further comprising applying a write mask to said complex conjugates.

9. The method of claim 7 wherein the complex conjugates are not rounded.

10. The method of claim 7 wherein said instruction has a format that specifies through an immediate operand which input vector format applies.

11. The method of claim 7 wherein said execution unit supports presenting the complex conjugates in a plurality of output vector formats that differ as to which output vector elements correspond to real parts and which output vector elements correspond to imaginary parts.

12. The method of claim 7 wherein said creating includes permuting said input vector elements.

13. An apparatus comprising:
a semiconductor chip having an instruction execution pipeline, said instruction execution pipeline having an execution unit to perform the following for an instruction:
accept input vector elements representing real and imaginary parts of a plurality of complex numbers, said input vector elements within a single input vector provided from a single vector register; and
present complex conjugates of said complex numbers, wherein the execution unit supports presenting the complex conjugates for a plurality of input vector formats that differ as to which input vector elements correspond to real parts and which input vector elements correspond to imaginary parts.

14. The apparatus of claim 13 wherein said execution unit includes write mask circuitry.

15. The apparatus of claim 13 wherein the complex conjugates are not rounded.

16. The apparatus of claim 13 wherein said instruction has a format that specifies through an immediate operand which input vector format applies.

17. The apparatus of claim 13 wherein said execution unit supports presenting the complex conjugates in a plurality of output vector formats that differ as to which output vector elements correspond to real parts and which output vector elements correspond to imaginary parts.

18. The apparatus of claim 13 wherein said execution unit is to permute said input vector elements.

19. The apparatus of claim 1 wherein said instruction has a format that specifies through an opcode which input vector format applies.

20. The apparatus of claim 13 wherein said instruction has a format that specifies through an opcode which input vector format applies.

* * * * *